(12) United States Patent
Ikarashi et al.

(10) Patent No.: US 8,149,613 B2
(45) Date of Patent: Apr. 3, 2012

(54) RESISTANCE VARIABLE MEMORY DEVICE

(75) Inventors: Minoru Ikarashi, Kanagawa (JP);
Yutaka Higo, Kanagawa (JP); Masanori Hosomi, Kanagawa (JP); Hiroshi Kano, Kanagawa (JP); Shinichiro Kusunoki, Kanagawa (JP); Hiroyuki Ohmori, Kanagawa (JP); Yuki Oishi, Kanagawa (JP); Tetsuya Yamamoto, Kanagawa (JP); Kazutaka Yamane, Kanagawa (JP)

(73) Assignee: Sony Corporation, Tokyo (JP)

( * ) Notice: Subject to any disclaimer, the term of this patent is extended or adjusted under 35 U.S.C. 154(b) by 302 days.

(21) Appl. No.: 12/629,671

(22) Filed: Dec. 2, 2009

(65) Prior Publication Data

US 2010/0135069 A1    Jun. 3, 2010

(30) Foreign Application Priority Data

Dec. 3, 2008 (JP) ................. 2008-309024

(51) Int. Cl.
 *G11C 11/00* (2006.01)
 *G11C 11/14* (2006.01)
 *G11C 11/15* (2006.01)
(52) U.S. Cl. ............. 365/158; 365/171; 365/173
(58) Field of Classification Search .......... 365/158
 See application file for complete search history.

(56) References Cited

U.S. PATENT DOCUMENTS

| 5,695,864 | A | 12/1997 | Slonczewski | |
| 7,224,598 | B2 * | 5/2007 | Perner | 365/148 |
| 7,408,803 | B2 * | 8/2008 | Freitag et al. | 365/158 |
| 7,826,255 | B2 * | 11/2010 | Xi et al. | 365/158 |
| 8,045,366 | B2 * | 10/2011 | Zheng et al. | 365/158 |
| 2003/0072174 | A1 | 4/2003 | Savtchenko et al. | |
| 2010/0220513 | A1 * | 9/2010 | Kim et al. | 365/148 |

FOREIGN PATENT DOCUMENTS

| JP | 10-116490 | 5/1998 |
| JP | 2007-188578 | 7/2007 |
| JP | 2008-016503 | 1/2008 |
| JP | 2008-091794 | 4/2008 |
| JP | 2009-152258 | 7/2009 |

OTHER PUBLICATIONS

Japanese Office Action issued on Oct. 5, 2010, for corresponding Japanese Patent Application No. 2008-309024.
J. Nahas et al., IEEE/ISSCC 2004 Visulas Supplement pp. 22.
J.Z. Sun, "Spin-current interaction with a monodomain magnetic body: A model study," Phys. Rev. B, vol. 62, No. 1, pp. 570-578, 2000.
J.C. Slonczewski, "Current-driven excitation of magnetic multilayers," Journal of Magnetism and Magnetic Materials, 159, L1-L7, 1996.
Y. Suzuki et al., "Theory and experiments on the spin-transfer magnetization reversal," The 134th Topycal Symposium of The Magnetics Society of Japan, pp. 53-62, 2004.

* cited by examiner

*Primary Examiner* — Son Mai
(74) *Attorney, Agent, or Firm* — K&L Gates LLP

(57) ABSTRACT

A resistance variable memory device is provided and includes a resistance variable memory cell that writes data by utilizing a spin transfer effect based on an injection current. The memory device also includes a driving circuit that generates a combined pulse of a plurality of write pulses and an offset pulse defining the level between the write pulses and supplies the combined pulse to the memory cell at the time of the writing.

9 Claims, 17 Drawing Sheets

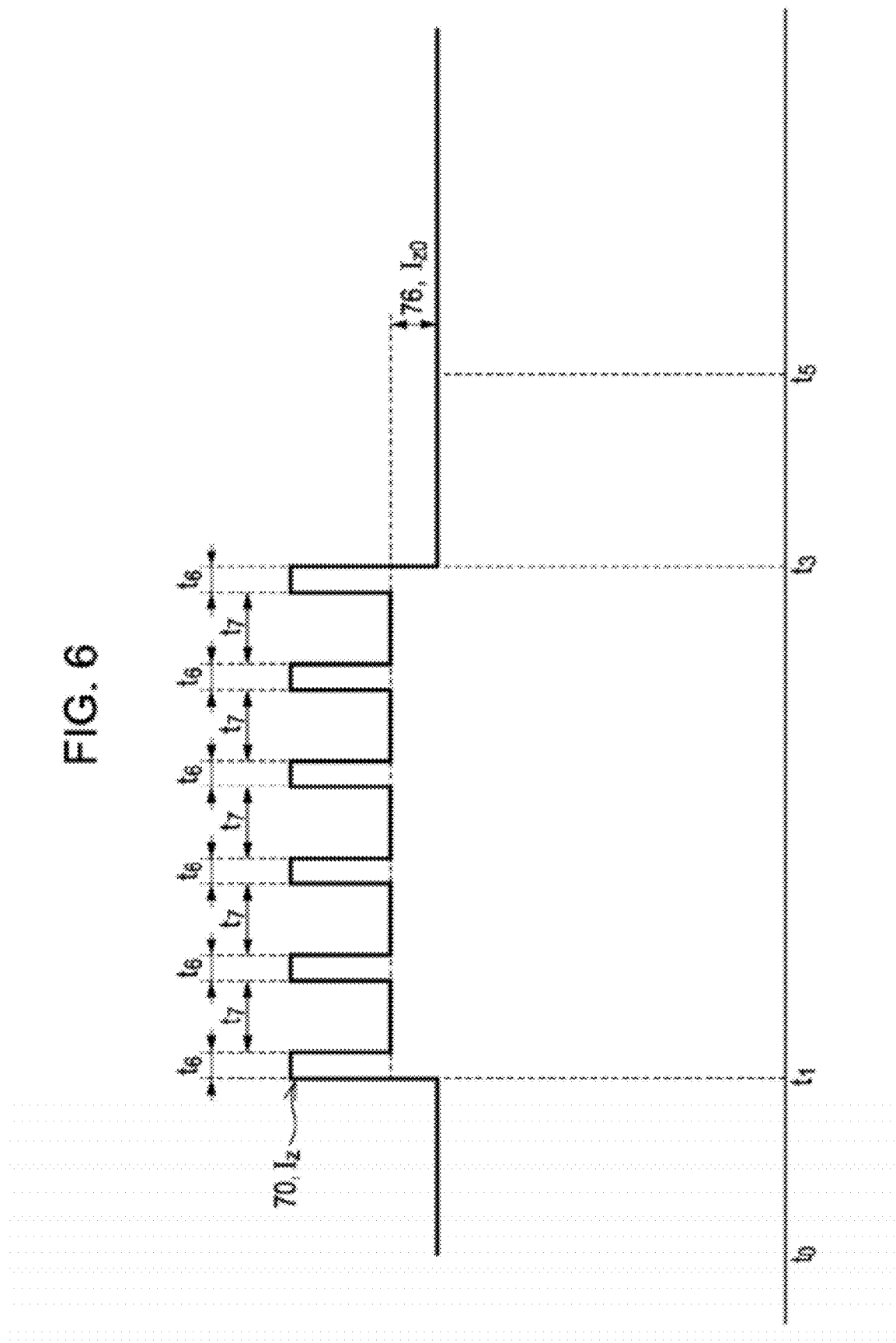

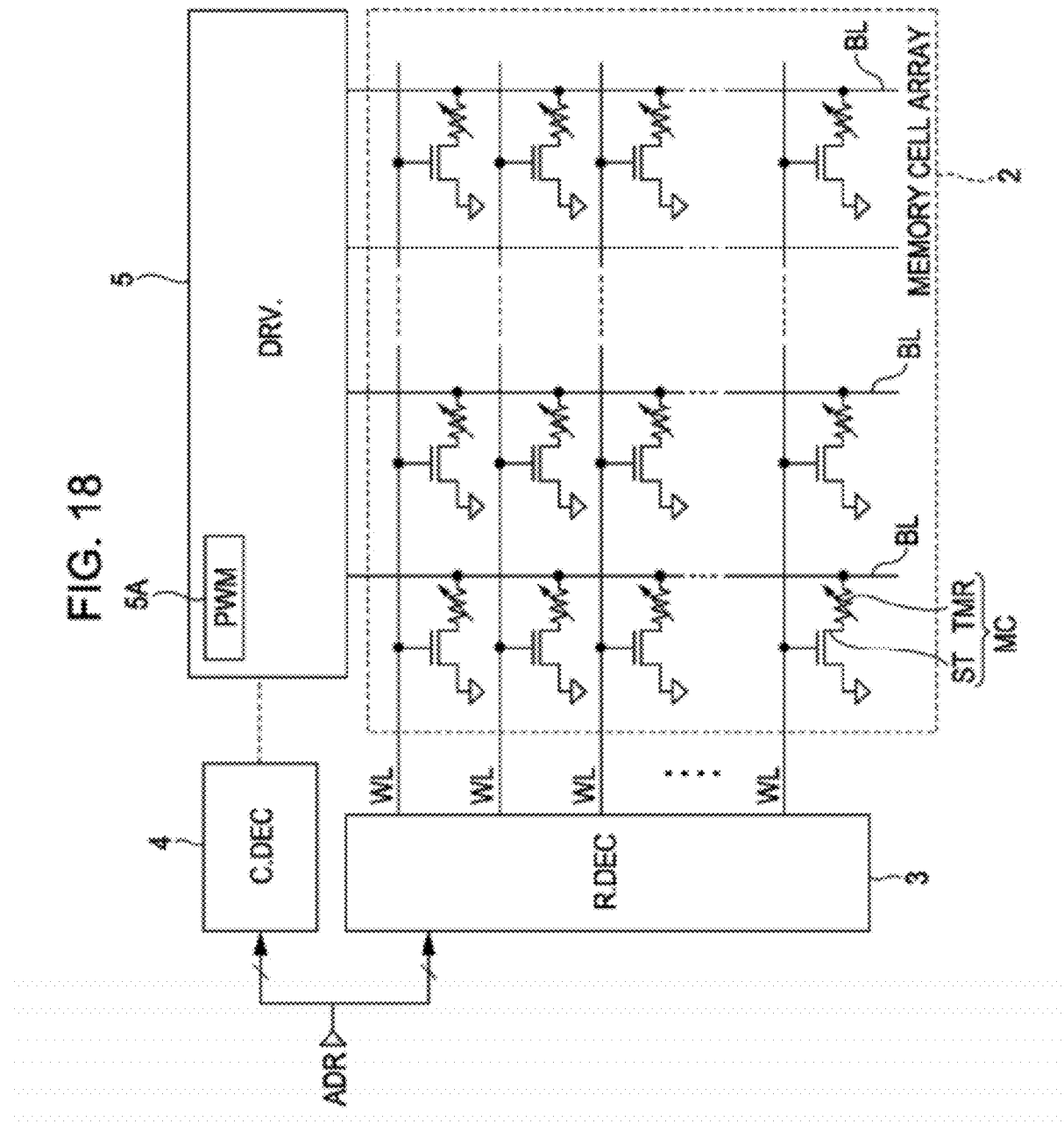

RESISTANCE VARIABLE MEMORY DEVICE

CROSS REFERENCES TO RELATED APPLICATIONS

The present application claims priority to Japanese Priority Patent Application JP 2008-309024 filed in the Japan Patent Office on Dec. 3, 2008, the entire content of which is hereby incorporated by reference.

BACKGROUND

The present disclosure relates to a resistance variable memory device that writes data by using a spin transfer effect based on injection current.

Data communication apparatuses, in particular, personal small-sized apparatuses such as portable communication terms have widely and increasingly been used among consumers. Along with this popularity, enhanced performance, such as higher integration, increased processing speed, and lower consumption of power have been demanded for devices employed in such apparatuses, such as memory and logic devices. In particular, nonvolatile memories are considered as significant components for enhancement of the performance in such apparatuses.

The nonvolatile memories practically used in the related arts include semiconductor flash memories and ferroelectric nonvolatile memories (FeRAMs). These memories have been actively researched and developed for achieving higher performance.

Lately, as a nonvolatile memory using a magnetic material, magnetic random access memories (MRAMs) utilizing a tunnel magneto-resistance effect have been disclosed and attracted much attention (for example, refer to "J. Nahas et al., IEEE/ISSCC 2004 Visulas Supplement, page 22").

The principle of operation of an MRAM will be described briefly.

The MRAM is a magnetic data recording device having a structure in which minute storage carriers made of magnetic materials are regularly arranged and wirings are wired so as to allow accessing the respective storage carriers.

When current is allowed to flow into both conductive lines (word lines) and readout conductive lines (bit lines) which are disposed above or below the magnetic storage carriers, a combined current magnetic field is generated. Data are written to the MRAM by controlling the magnetization of each magnetic material by using the combined current magnetic field.

Generally, depending on the direction of the magnetization, data of "0" and "1" are stored. As a typical method of rewriting data of a device, a method that utilizes asteroid characteristics is known (for example, refer to Japanese Unexamined Patent Application Publication No. 10-116490). Moreover, a method that utilizes switching characteristics (for example, refer to US Patent Publication No. 2003-072174).

The data are read out as follows. A memory cell is selected using an element such as a transistor and the direction of magnetization is extracted as a voltage signal in accordance with a current magnetic effect.

As a proposed film structure of the memory cell, there is known a three-layer junction structure (ferromagnetic tunnel junction; magnetic tunnel junction, abbreviated to MTJ) including a ferromagnetic material, an insulating material, and a ferromagnetic material. This structure will be referred to as an MTJ structure.

In the MTJ structure, one ferromagnetic layer is used as a fixed reference layer in which the magnetization direction is fixed, and the other ferromagnetic layer is used as a recording layer (free layer). In this way, the MTJ structure causes the direction of magnetization of the recording layer to correspond to the voltage signal in accordance with the tunnel magneto-resistance effect.

The MRAM is capable of rewriting the data "0" and "1" by reversing the magnetization directions of the magnetic materials at high speed and substantially without a limit of times ($10^{15}$ or more). This is the major advantage of the MRAM as compared with other nonvolatile memories.

On the other hand, the MRAM consumes much power since a large amount of current (for example, several mA to several tens of mA) has to be passed to the wirings. Moreover, since the MRAM has to include both the word lines for recording and the bit lines for reading, it may be difficult to reduce the size of the memory cells. Furthermore, when the size of the MTJ structure is decreased, the magnetic field necessary for the magnetization reversal increases. Thus, the MRAM is disadvantageous in scaling from the power consumption perspective.

As one solution to the problems, recording methods that do not use the current magnetic field have been researched. Among them, a recording method that uses magnetization reversal based on spin-transfer has been actively researched (for example, refer to U.S. Pat. No. 5,695,864).

A memory device employing the spin-transfer magnetization reversal is configured by the same MTJ structure as the MRAM. The spin-transfer magnetization reversal utilizes the fact that when spin-polarized electrons passing through a magnetic layer where the magnetization direction is fixed enter a free layer, a torque is applied to the magnetic layer. Specifically, when current of a threshold value or more flows, the magnetization direction of the free layer is reversed.

The data "0" and "1" are rewritten when the polarity of the current is changed.

The absolute value of the current for achieving the magnetization reversal is several mA or less in a memory device of about 0.1 μm scale, and the absolute value decreases in proportion to the volume of the memory device. In this respect, the memory device employing the spin-transfer magnetization reversal is advantageous in scaling.

Moreover, since the memory device employing the spin-transfer magnetization reversal is not necessary to include the word lines for recording, which are necessary for the MRAM, there is such an advantage that the configuration of memory cells can be simplified.

The data are read by utilizing the tunnel magneto-resistance effect similar to the MRAM.

In this specification, the MRAM that utilizes the spin-transfer will be referred to as a spin transfer random access memory (SpRAM). In addition, a spin-polarized current for causing the spin-transfer will be referred to as a spin injection current.

Great expectations are focused on the SpRAM as a nonvolatile memory enabling to realize low power consumption and large storage capacity while maintaining the advantages of the MRAM which is capable of rewriting data at high speed and substantially without a limit of times.

In the proposed SpRAM, the data "0" and "1" are rewritten by changing the polarity of the spin injection current.

However, the result of the magnetization reversal may not necessarily be determined by only the polarity of the spin injection current due to the natural instability of the spin-transfer magnetization reversal.

In the SpRAM, in addition to the magnetization state corresponding to the data "0" and "1," a quasi-stable state exists which is realized only when the spin injection current flows. The instable result of the magnetization reversal results from a phenomenon in which the magnetization state being presently trapped in the quasi-stable state becomes indefinite after the current stops flowing.

It is therefore desirable to provide a resistance variable memory device which can be driven by a spin injection current, thus achieving a stable magnetization reversal over a wide range of injection current.

SUMMARY

According to an embodiment, a resistance variable memory device includes a resistance variable memory cell that writes data by utilizing a spin transfer effect based on an injection current; and a driving circuit that generates a combined pulse of a plurality of write pulses and an offset pulse defining the level between the write pulses and supplies the combined pulse to the memory cell at the time of the writing.

According to this configuration, the magnetization reversal that leads to a change in resistance corresponding to the density of the current is realized by the pulse current generated by the pulse application. Thereafter, in the hold time, the offset pulse of positive or negative polarity is applied to the memory cell. For this reason, the current of the same direction as the reversal remains in the non-zero state, or the magnetization is fixed by the reverse current. Therefore, the rotation of the magnetization after the reversal is restricted to the vicinity of the reversed orientation, and thus the magnetization is prevented from being rotated to a unintended quasi-stable state.

In the embodiment, the polarity of the offset pulse may be positive or negative.

When a short pulse is repeated for a predetermined duration and hold time, the pulse frequency will become extremely high. In such a case, the pulse frequency can be decreased by applying the offset pulse of opposite direction, whereby the circuit burden imposed on the driving circuit can be reduced.

According to another embodiment, a resistance variable memory device includes a resistance variable memory cell that writes data by utilizing a spin transfer effect based on an injection current; and a driving circuit that generates a combined pulse of a plurality of write pulses and an offset pulse having a polarity opposite to the write pulse and defining the level between the write pulses and supplies the combined pulse to the memory cell at the time of the writing.

According to this configuration, the offset pulse has a polarity opposite to the write pulse. Therefore, a force that fixes the magnetization can be exerted regardless of whether a current opposite to a write current flows or not. Therefore, the pulse duration of the write pulse can be increased, and thus the driving frequency can be decreased.

According to the embodiments, it is possible to provide a resistance variable memory device which can be driven by a spin injection current, thus achieving a stable magnetization reversal over a wide range of injection current.

Additional features and advantages are described herein, and will be apparent from the following Detailed Description and the figures.

BRIEF DESCRIPTION OF THE FIGURES

FIG. 6 is a timing diagram showing the application time of an injection current in a SpRAM according to a first embodiment;

FIG. 18 is a schematic diagram showing an overall configuration of a memory device for illustrating a driving circuit according to the first or second embodiment.

DETAILED DESCRIPTION

Hereinafter, the embodiments will be described by way of a SpRAM with reference to the drawings.

First, the sectional device structure and the phenomenon which are common to the first and second detailed embodiments will be described.

Common Sectional Device Structure of Embodiments

Figure 1:
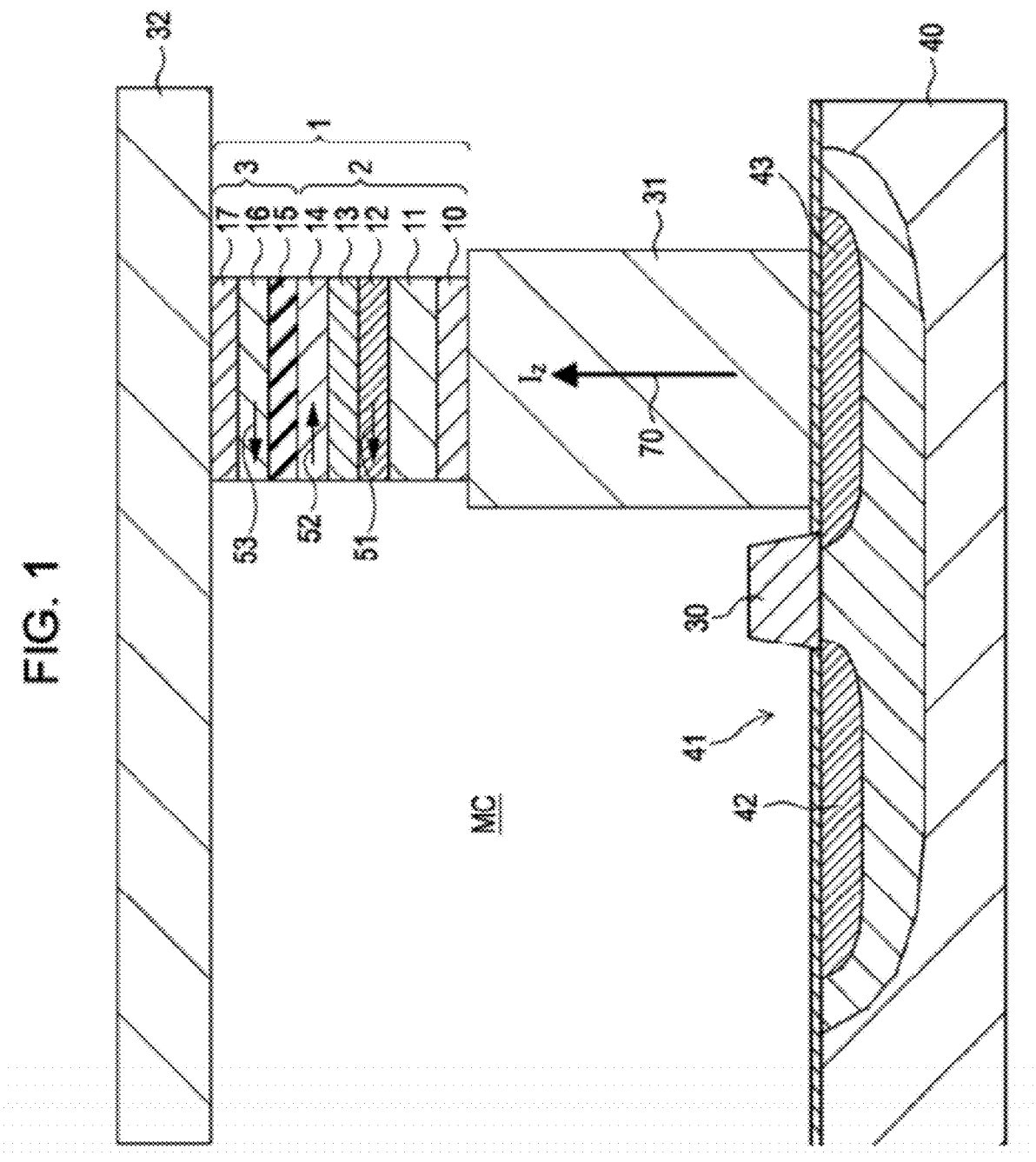
FIG. 1 is a schematic sectional view of a memory cell of a SpRAM according to a comparative example.

FIG. 1 is a schematic sectional view of a memory cell MC of a SpRAM that achieves the reversal of the data "0" and "1" using a spin injection current, in which the idea of the present invention is not applied.

The memory cell MC shown in FIG. 1 has a configuration in which a tunnel magneto-resistance effect element 1 and a select element are connected in series between a bit line 32 used as an upper wiring and a source line (not shown).

The select element is configured to electrically select a memory cell for reading or writing and can be configured by a diode, a MOS transistor, or the like. In the example shown in FIG. 1, a MOS transistor (select transistor 41) is used as the select element.

The diffusion layers 42 and 43 of the select transistor 41 are formed on a Si substrate 40 so as to be spaced apart with a channel forming region disposed between them. The diffusion layers 42 and 43 are implanted with impurities so as to have a conductivity opposite to that of the channel forming region and are maintained in a low-resistance state. Among them, the diffusion layer 42 is connected to the source line at non-illustrated locations.

The diffusion layer 43 is connected to one end (lower end) of the tunnel magneto-resistance effect element 1 via a connection plug 31.

The other end (upper end) of the tunnel magneto-resistance effect element 1 is connected to the bit line 32. The gate of the select transistor 41 has a laminated structure of a thin gate insulating film and a gate conductive layer which are not shown. The gate conductive layer functions as a select signal line 30 and is also connected to another select signal line 30.

The tunnel magneto-resistance effect element 1 includes a memory layer 16 where the magnetization is rotated relatively easily, and fixed magnetization layers 12 and 14.

For example, the memory layer 16 and the fixed magnetization layers 12 and 14 may be made of nickel (Ni), iron (Fe), cobalt (Co), or a ferromagnetic material including alloys thereof as a main component.

In some cases, the memory layer 16 is configured by a plurality of magnetic layers which is often collectively referred to as a free layer 3. In the example shown in FIG. 1, the free layer 3 is configured to include a tunnel barrier layer 15, a memory layer 16, and a non-magnetic layer 17 in that order from below.

The fixed magnetization layer 12 and the fixed magnetization layer 14 are linked by an anti-ferromagnetic coupling via the non-magnetic layer 13, and the fixed magnetization layer 12 is formed in contact with an antiferromagnetic material 11. The fixed magnetization layers 12 and 14 have a strong unidirectional magnetic anisotropy caused by exchange interaction between the layers, and are often collectively referred to as a fixed layer 2. In the example shown in FIG. 1, the fixed layer 2 is configured to include a ground layer 10, the antiferromagnetic material 11, the fixed magnetization layer 12, the non-magnetic layer 13, and the fixed magnetization layer 14 in that order from below.

For example, the non-magnetic layer 13 and the non-magnetic layer 17 may be made of tantalum (Ta), copper (Cr), ruthenium (Ru), and the like. In a static state, the magnetization 51 of the fixed magnetization layer 12 and the magnetization 52 of the fixed magnetization layer 14 (the magnetization will be referred to as reference layer magnetization) are almost completely in an anti-parallel state due to the strong anti-ferromagnetic coupling via the non-magnetic layer 13.

In general, the fixed magnetization layers 12 and fixed magnetization layers 14 have the same saturated magnetization film thickness product. Thus, a leaked component of a magnetic-pole field is sufficiently small to be negligible.

For example, the antiferromagnetic material may be made of manganese alloys including iron (Fe), nickel (Ni), platinum (Pt), iridium (Ir), rhodium (Rh) or the like, cobalt (Co) or nickel oxides, or the like.

A tunnel barrier layer 15 is disposed between the memory layer 16 and the fixed magnetization layer 14. The tunnel barrier layer 15 is made of an oxide layer of aluminum (Al), magnesium (Mg), silicon (Si), or the like or an insulating material of nitride. The tunnel barrier layer 15 performs a role of breaking the magnetic coupling between the memory layer 16 and the fixed magnetization layer 14 and allowing a tunnel current to flow.

The magnetic layers and conductive layers are mainly formed by a sputtering method. The tunnel barrier layer 15 may be obtained by oxidizing or nitrifying a metal film which is formed by the sputtering method.

The non-magnetic layer 17 is a top-coating film and performs a role of preventing mutual diffusion between the wirings connecting the tunnel magneto-resistance effect elements, reducing contact resistance, and preventing oxidation of the memory layer 16. The top-coating film is generally made of copper (Cu), tantalum (Ta), titanium nitride, or the like.

The ground layer 10 has a function of improving the crystallinity of layers laminated thereon. For example, chromium (Cr), tantalum (Ta) or the like may be used for the ground layer 10.

The state of a memory cell can be determined depending on whether the magnetization 53 of the memory layer 16 (the magnetization will be referred to as a memory layer magnetization) and the magnetization 52 (reference layer magnetization) of the fixed magnetization layer 14 are in the parallel state or the anti-parallel state.

In order to read or rewrite the state of the memory cell, it is necessary to supply a spin injection current 70.

The spin injection current 70 passes through the diffusion layer 43, the tunnel magneto-resistance effect element 1, and the bit line 32.

Figure 2:
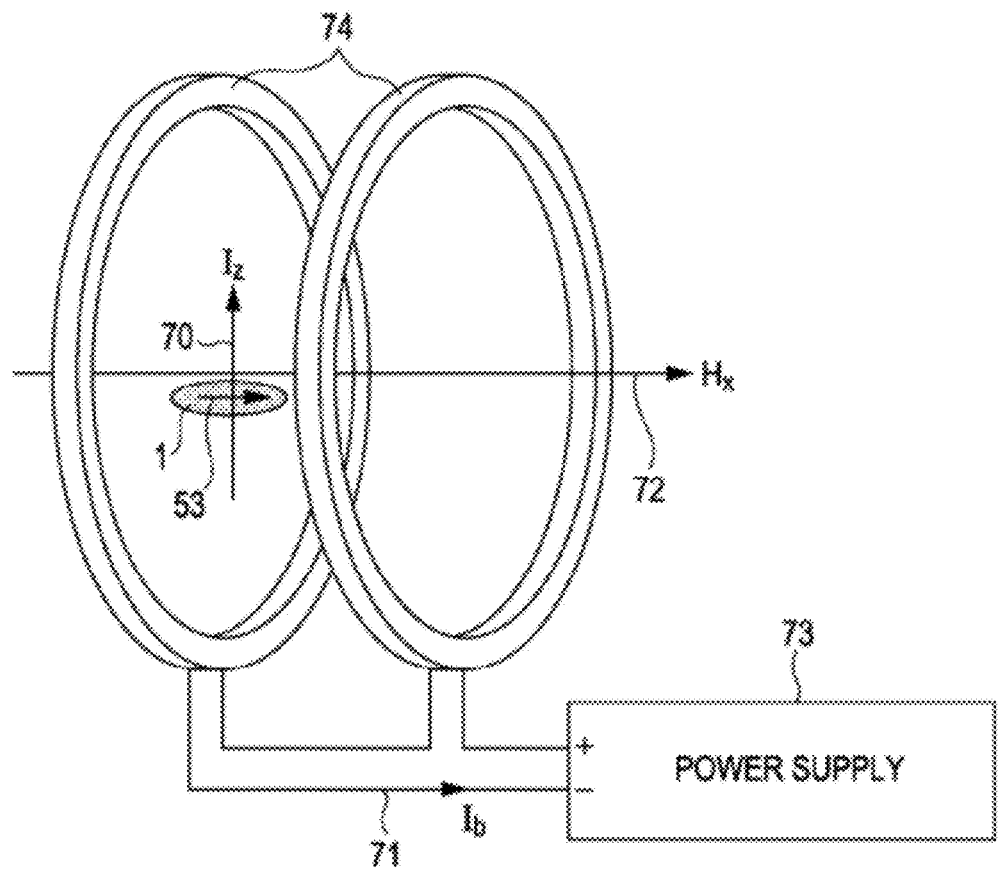
FIG. 2 is a schematic diagram showing an apparatus for measuring the characteristics of the SpRAM, which can be used with the embodiments.

FIG. 2 shows an example of an apparatus measuring the characteristics of the SpRAM.

The free layer magnetization 53 of the tunnel magneto-resistance effect element 1 can be changed by a bias current magnetic field 72 as well as the spin injection current 70 so that the data "0" and "1" are reversed.

A state diagram of a memory cell in which the vertical axis represents the pulse peak value of the spin injection current 70 and the horizontal axis represents the pulse peak value of the bias current magnetic field 72 will be referred to as a phase diagram.

The apparatus shown in FIG. 2 uses a Helmholtz coil 74 to generate the bias current magnetic field 72. The bias current 71 flowing in the Helmholtz coil 74 is supplied independently from an external power supply 73. The spin injection current 70 flows in or out from a separate driving circuit through the bit line 32 connected to the memory cell.

Using the apparatus shown in FIG. 2, the intensity and phase of the spin injection current 70 and the bias current magnetic field 72 can be set arbitrarily and the values necessary for creating the phase diagram can be measured.

Figure 3:
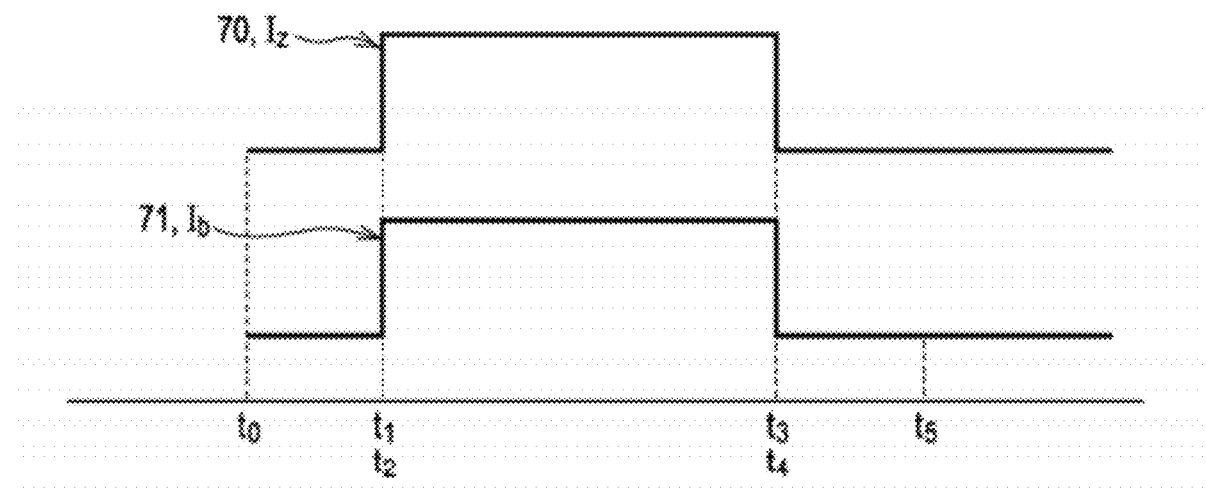
FIG. 3 is a timing diagram showing the pulse application times of a spin injection current and a bias current used for the measurement in the embodiments.

FIG. 3 is a timing diagram showing the pulse application times of the spin injection current 70 and the bias current 71.

In FIG. 3, $t_0$ denotes the initial state of the memory cell. The spin injection current 70 and the bias current 71 are assumed as rectangular pulses in order to simplify the description.

The rise times of the spin injection current 70 and the bias current 71 are denoted by "$t_1$" and "$t_2$," respectively. The fall times of the spin injection current 70 and the bias current 71 are denoted by "$t_3$" and "$t_4$," respectively.

At time $t_5$, the resistance state which is determined by the angle between the memory layer magnetization 53 and the reference layer magnetization 52 is read, whereby the finished state of the memory cell is determined.

Figure 4:
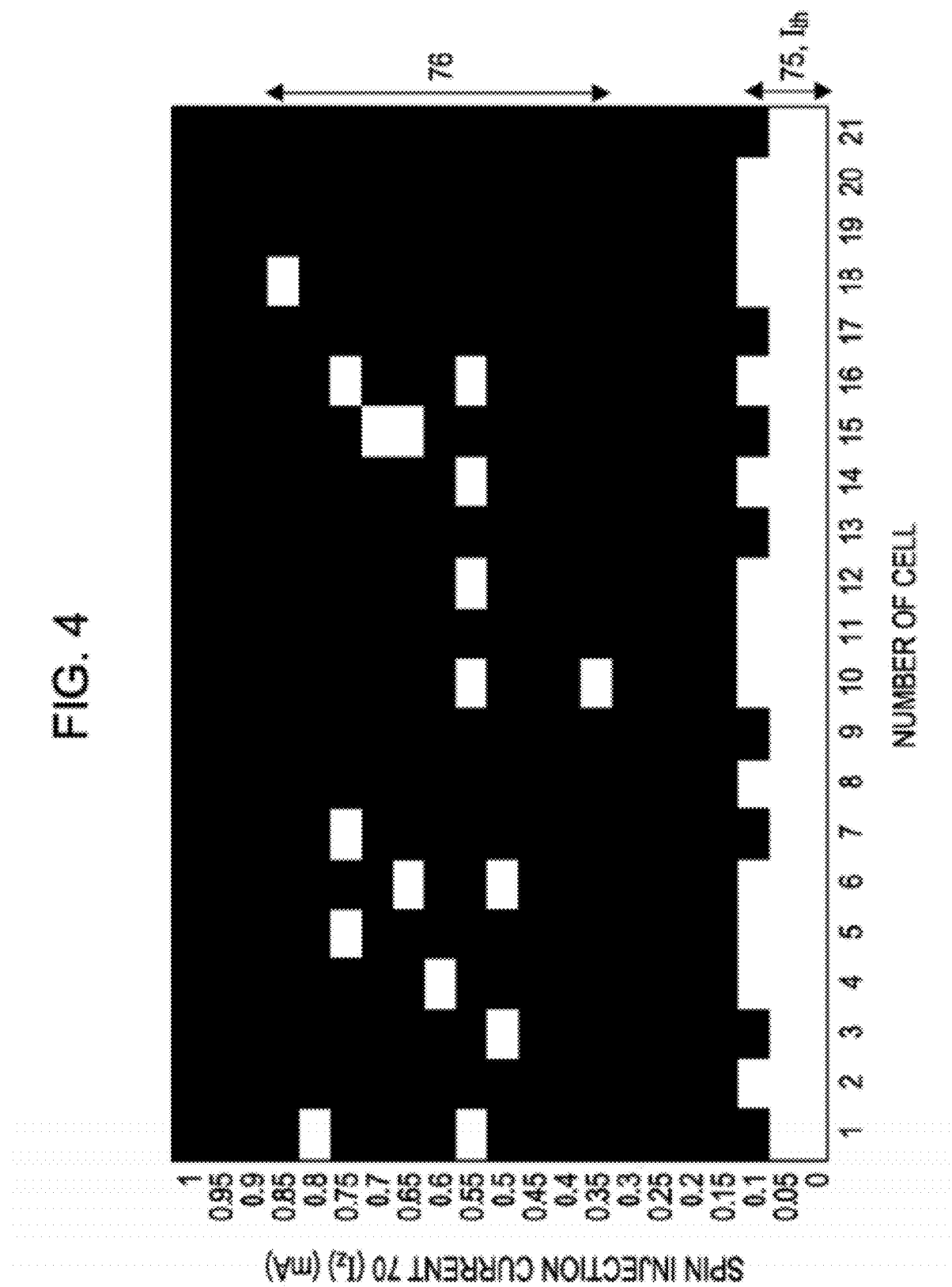
FIG. 4 is a state diagram of the memory cells with a pulse duration of 10 [ns] according to the SpRAM of the comparative example.

FIG. 4 is a state diagram of the memory cells of a SpRAM with a pulse duration of 10 [ns] in which the idea of the present invention is not applied. The memory cell state diagram shows the correlation between the spin injection current value and the cell state, in which the vertical axis represents the pulse peak value of the spin injection current 70 and the horizontal axis represents the address of the memory cells.

The initial state of the memory cells prior to supplying the spin injection current can be controlled by the polarity of the bias current magnetic field 72, for example, so that the memory layer magnetization 53 and the reference layer magnetization 52 are in the anti-parallel state.

Description of Common Phenomenon of Embodiments

According to Suzuki and Yagami, "Theory and Application of Spin Injection Magnetization Reversal", the 134th Journal of Magnetics Society of Japan, 2004, page 53 and J. C. Slonczewski, "Current-Driven Excitation of Magnetic Multilayers", Journal of Magnetism and Magnetic Materials, 1996, page L1, the magnitudes of the torque acting on the free layer magnetization 53 upon application of the spin injection current 70 and the torque (spin-transfer torque) transmitted from spin-polarized electrons are generally given by Equation 1 below.

Equation 1

$$\vec{T} = M_s \vec{m} \times \vec{H}_{\mathit{eff}} + \frac{g\hbar}{e} \frac{J_z}{t_F} \vec{m} \times \vec{m} \times \vec{m}_{\mathit{ref}} \quad (1)$$

In this equation, $M_s$ is a saturated magnetization of the memory layer 16; $H_{\mathit{eff}}$ is an effective magnetic field acting on the memory layer magnetization 53; g is a spin injection efficiency; $\hbar$ is the planck constant; e is electron charge; $J_Z$ is spin injection current density; $t_F$ is a film thickness of the memory layer 16; $\vec{m}$ is a unit magnetization vector of the memory layer magnetization 53; and $\vec{m}_{\mathit{ref}}$ is a unit magnetization vector of the reference layer magnetization 52.

The spin injection current density is identical to the value obtained by dividing the spin injection current 70 applied to the memory layer 6 by the cross-sectional area $S_A$ of the tunnel magneto-resistance effect element 1.

For example, when the cross-sectional area $S_A$ of the magneto-resistance effect element 1 is $1.2 \times 10^{-10}$ cm$^2$ and the current density $J_Z$ is 10 MA/cm$^2$, the spin injection current $I_z$ will be about 1.2 mA.

The first term on the right side of Equation 1 represents the torque from the effective magnetic field and corresponds to the potential energy of the memory layer magnetization 53.

The second term on the right side of Equation 1 represents the spin-transfer torque and corresponds to the kinetic energy of conduction electrons.

The relaxation time during which the memory layer magnetization 53 is relaxed from the initial state to the finished state by only the torque from the effective magnetic field without the rotation of the spin-transfer magnetization can be expressed by Equation 2 below.

Equation 2

$$\tau_1 = \frac{1}{|\gamma|\alpha(H_k + 2\pi M_s)} \quad (2)$$

In this Equation, $\alpha$ represents the damping constant of the memory layer 16; $H_k$ represents the anisotropic magnetic field of the memory layer 16, and $\gamma$ represents the gyromagnetic constant of electrons.

For example, when the anisotropic magnetic field $H_k$ of the memory layer 16 is 25 Oe, the saturated magnetization $M_s$ is 400 emu/cc, and the damping constant $\alpha$ is 0.007, the relaxation time $\tau_1$ will be about 3.2 ns.

When the spin injection current 70 is allowed to flow, the spin-transfer torque acts against the static magnetic energy or the anisotropic energy to rotate the memory layer magnetization 53. The magnitude of the rotational angular velocity of the memory layer magnetization 53 can be expressed by Equation 3 below.

Equation 3

$$\omega_{\mathit{spin}} = \frac{\gamma g \hbar}{e} \frac{J_z}{M_s t_F} \quad (3)$$

For example, when the saturated magnetization $M_s$ of the memory layer 16 is 400 emu/cc, the film thickness $t_F$ is 2 nm, the injection efficiency g is 0.68, and the current density $J_Z$ is 10 MA/cm$^2$, the angular rotation frequency $\omega_{\mathit{spin}}/2\pi$ will be about 1.6 GHz.

The white areas in the memory cell state diagram shown in FIG. 4 represent the switching finished state at time $t_5$ of FIG. 3.

More specifically, the white areas in FIG. 4 represent that the finished state is in the anti-parallel state ("0" state) and is not changed from the initial state. The black areas in FIG. 4 represent that the finished state is in the parallel state ("1" state) and is changed from the initial state.

The minimum current value of the spin injection current necessary for changing the memory cell state between "0" to "1" is referred to as a threshold current 75.

According to J. Z. Sun, "Spin-current interaction with a monodomain Magnetic body", A model study, Phys. Rev. B 62, 2000, page 570, when the pulse width is assumed infinitely long, the threshold current can be expressed by Equation 4 below.

Equation 4

$$I_{th0} = \frac{2e\alpha M_s S_A t_F (H_k + H_x + 2\pi M_s)}{g\hbar} \quad (4)$$

Since the actual pulse width is finite, the threshold current 75 is greater than the value given by Equation 4.

In the equation, $H_x$ represents the bias current magnetic field 72. For example, it will be assumed that the anisotropic magnetic field $H_k$ of the memory layer 16 is set to 25 Oe, the saturated magnetization $M_s$ is set to 400 emu/cc, the film thickness $t_F$ is set to 2 nm, and the bias current magnetic field $H_x$ is set to 0 Oe. Moreover, it will be assumed that the injection efficiency g is set to 0.68, the cross-sectional area $S_A$ of the magneto-resistance effect element 1 is set to $1.2 \times 10^{-10}$ cm$^2$, and the damping constant $\alpha$ is set to 0.007. In that case, the threshold current $I_{th0}$ will be about 0.074 mA.

In the MRAM including the SpRAM, it is desirable that there are two stable magnetization states where "0" and "1" are definite; however, it is undesirable that there is any unstable area where "0" and "1" are indefinite.

When the spin-transfer torque does not exist, for example, in the MRAM in which the idea of the present invention is not applied, the stable magnetization state corresponds to the valleys of the potential energy of the memory layer magnetization 53. Therefore, the stable magnetization state is limited to any one of the state where the free layer magnetization 53 and the reference layer magnetization 52 are in the antiparallel state and the state where they are in the parallel state.

When the initial state is caused to transition to a unstable energy stage by application of an external current magnetic field or the like, the finished state can be made opposite to the initial state.

However, in the case of the SpRAM, in addition to the magnetization state corresponding to the data "0" and "1," a quasi-stable state exists which is realized only when the spin injection current flows. Therefore, in rare cases, the magnetization state being presently trapped in the quasi-stable state may become indefinite when the current stops flowing.

The quasi-stable state of the SpRAM corresponds to the valleys of the kinetic energy of conduction electrons and is oriented in a direction opposite to the valleys of the potential energy of the magnetization. In FIG. 4, the white areas where the finished state becomes identical to the initial state occur in an intermediate area of the current value $I_Z$ of the write pulse is large to some extent, and this area will be referred to as a unstable area 76. The presence of the unstable area 76 represents that the magnetization is trapped in the quasi-stable state in the course of transition.

Figure 5A:
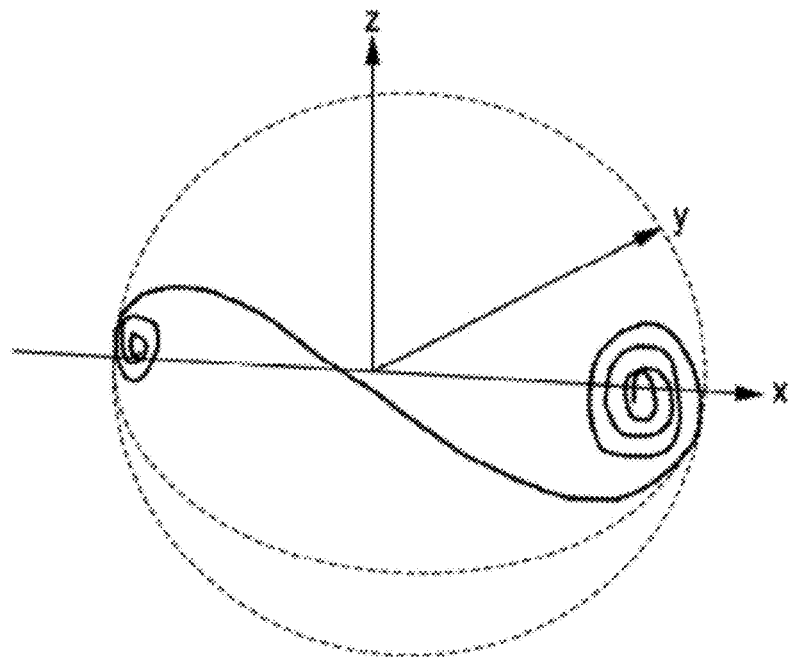
FIGS. 5A and 5B are schematic diagrams showing the transition process of magnetization, respectively when a magnetization reversal is realized normally and when the magnetization reversal is not realized normally.

FIG. 5A is a schematic diagram showing the transition process of magnetization when the magnetization reversal is realized normally.

It will be assumed that in the initial state, the memory layer magnetization 53 is oriented in the positive x-axis direction, and the reference layer magnetization 52 is oriented in the negative x-axis direction. When the injection current 70 equal to or greater than the threshold current given by Equation 4 flows, the magnetization will be reversed in the negative x-axis direction while performing a precessional movement around the x axis. The stable state includes the anti-parallel state ("0" state) and the parallel state ("1" state). However, in this case, when current equal to or greater than the threshold current 75 flows, one of the above states can be switched to the other state.

Figure 5B:
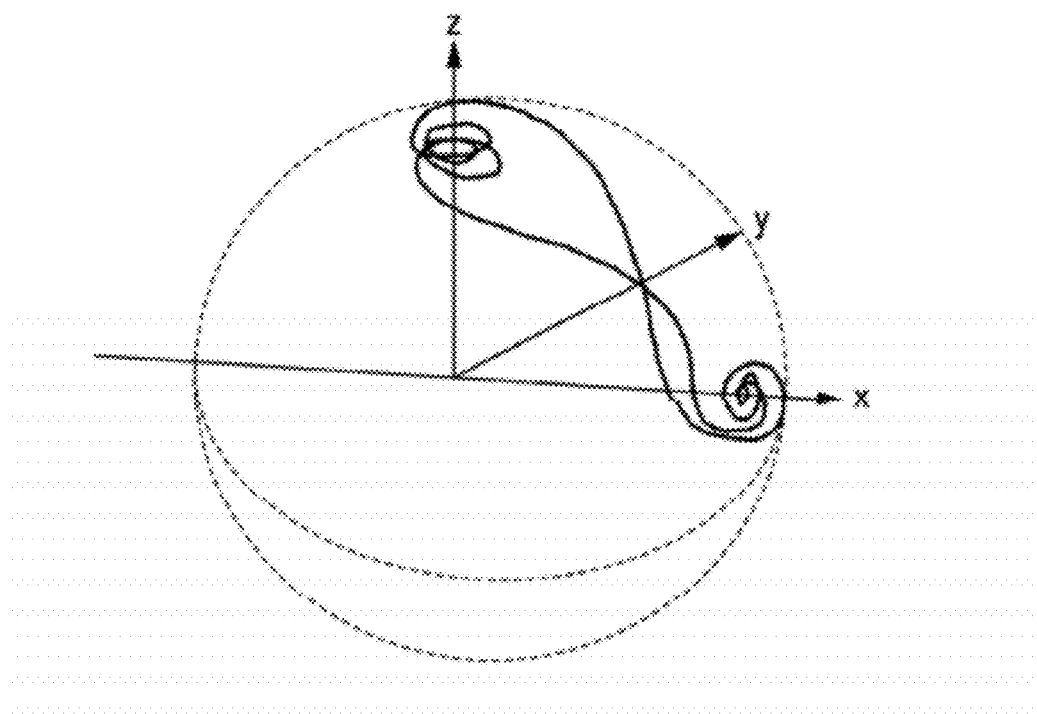

FIG. 5B is a schematic diagram showing the transition process of magnetization when the magnetization reversal is not realized normally.

It will be assumed that in the initial state, the memory layer magnetization 53 is oriented in the positive x-axis direction, and the reference layer magnetization 52 is oriented in the negative x-axis direction. When the injection current 70 equal to or greater than the threshold current given by Equation 4 flows, the magnetization will perform a precessional movement around the x axis, which will subsequently be changed to a precessional movement around the z axis. This is because the precessional movement around z axis is realized as the quasi-stable state. This phenomenon occurs in rare cases when the kinetic energy of conduction electrons exceeds the potential energy of the magnetization.

The quasi-stable state can exist only in a state where the conduction electrons gain the kinetic energy, namely during periods when the injection current 70 flows. Therefore, when the current stops flowing, the quasi-stable state will result in either "0" or "1" state.

FIG. 5B illustrates a case where the magnetization is trapped in the quasi-stable state in the course of switching, and thus, the finished state after the current is stopped returns to its initial magnetization state.

The described phenomenon in which the magnetization state becomes indefinite will deteriorate the reliability of data writing in the SpRAM.

Some writing errors may be corrected by an error correction circuit; however, in that case, the additional circuit may lead to an increase in the chip size and the power consumption.

Unless such an unstable phenomenon is eliminated, it would be difficult for the SpRAM to be used as the main storage memory. As a result, the value of the SpRAM as the nonvolatile memory for achieving an enhanced performance of data recording apparatuses will be greatly low.

First Embodiment

The reason why the switching finished state of the SpRAM transitions to a different state from an intended state is because the quasi-stable state which occurs temporarily due to the application of the injection current 70 prevents the transition from going along its intended path.

As long as the principle of the spin-transfer magnetization rotation is employed, it is difficult to completely prevent the temporary occurrence of the quasi-stable state.

However, if it is possible to identify the direction (the z-axis direction in the case of FIG. 5B) where the quasi-stable state exist, it would be possible to control the switching timing so that the memory layer magnetization 53 is not oriented in that direction.

FIG. 6 is a timing diagram showing the application time of the injection current 70 in the SpRAM according to the first embodiment.

The waveform shown in FIG. 6 is designed to perform switching using a combined waveform of a plurality of current pulse trains and offset pulses of the same polarity. During the duration $t_6$ of the current pulse train, since the spin-transfer torque is greater than the torque from the effective magnetic field, the rotation angle per unit time of the memory layer magnetization 53 can be generally expressed by Equation 3.

The duration $t_6$ of the current pulse train is determined so as to satisfy Equation 5 below.

That is to say, the condition that the magnetization rotation angle does not exceed a critical angle is given by the following equation.

$$\omega_{spin} t_6 < \theta_{critical} \quad \text{Equation 5}$$

Equation 5 means that the rotation angle per one pulse is restricted to be equal to or smaller than the critical angle $\theta_{critical}$.

As a result of thorough investigation on the magnetization characteristics, it was found that in the first embodiment, the critical angle $\theta_{critical}$ is identical to 90 degrees. The magnetization state can be switched to any of the stable states by repeating a small amount of magnetization rotation corresponding to a current density so that the memory layer magnetization 53 is not oriented in the direction of the quasi-stable state.

The repeated small magnetization rotation can be realized by only using the combined waveform with the offset pulses. However, in order to realize the magnetization rotation corresponding to the current density, the duration $t_6$ of the pulse train desirably satisfy the relation of Equation 5. However, it is permitted that the rotation angle per one pulse is identical to the critical angle.

For example, it will be assumed that the saturated magnetization $M_s$ of the memory layer 16 is set to 400 emu/c, the film thickness $t_F$ is set to 2 nm, the injection efficiency g is set to 0.68, and the current density $J_Z$ is set to 10 MA/cm². In that case, since the angular rotation frequency $\omega_{spin}/2\pi$ will be about 1.6 GHz, a relation of $t_6 < 160$ ps should be met in order to satisfy the relation of Equation 5.

Since the magnetization rotation frequency decreases as the current density decreases, the duration $t_6$ of the current pulse train may be increased further.

For example, if the current density $J_Z$ is set to 10 MA/cm$^2$, the duration of the pulse train satisfying the relation of $t_6<1.60$ ns can be achieved. By doing so, it is possible to reduce the circuit burden imposed on a pulse generation circuit (a driving circuit; refer to a later-described PWM circuit).

The duration $t_6$ of the current pulse train can be controlled by performing pulse width modulation in accordance with the current density. Therefore, a pulse width modulation circuit that detects a voltage proportional to the current density to control the modulation degree can be used.

The rotational angular velocity of the magnetization expressed by Equation 3 has a property that it is inverse proportional to the saturated magnetization of the memory layer 16. Therefore, when a change in the saturated magnetization due to self-heating or ambient temperature is not negligible, it is preferable to control the pulse width modulation circuit in consideration of the influence of temperature.

The hold time $t_7$ between one current pulse and a next current pulse is the time necessary for the memory layer magnetization 53 to return to the vicinity of a plane where the stable state exists. By appropriately maintaining the hold time, the memory layer magnetization 53 can be prevented from being oriented in the direction of the quasi-stable state.

During the hold time $t_7$, since the torque from the effective magnetic field is not negligible compared to the spin-transfer torque, the relaxation time of the memory layer magnetization 53 is given by Equation 2.

As a result of thorough investigation on the magnetization characteristics, the hold time $t_7$ between one current pulse and a next current pulse desirably satisfy the relation of Equation 6.

$$0.1\tau_1 \leq t_7 \leq 1.5\tau_1 \quad \text{Equation 6}$$

For example, it will be assumed that the anisotropic magnetic field $H_k$ of the memory layer 16 is set to 25 Oe, the saturated magnetization $M_s$ is set to 400 emu/cc, and the damping constant $\alpha$ is set to 0.007. In that case, since the relaxation time $\tau_1$ will be about 3.2 ns, a relation of 0.32 ns$<t_7<$4.8 ns should be met in order to satisfy the relation of Equation 6. When it is inappropriate to treat the hold time $t_7$ as a fixed value, it is preferable to use a pulse width modulation circuit.

The relaxation time expressed by Equation 2 has a property that it is inverse proportional to the saturated magnetization of the memory layer 16. Therefore, when a change in the saturated magnetization due to self-heating or ambient temperature is not negligible, it is preferable to control the pulse width modulation circuit in consideration of the influence of temperature.

FIGS. 7 to 11 show the memory cell state diagrams when the hold time $t_7$ was increased from zero ($0.0\tau_1$), $0.1\tau_1$, $0.15\tau_1$, ..., and $3.0\tau_1$ by gradually increasing the scale factor relative to the relaxation time $\tau_1$ of the memory layer magnetization.

The described memory cell state diagram shown in FIG. 4 illustrates the distribution of the memory cell states when the bias current magnetic field 72 (the external magnetic field $H_k$) is set to zero ($H_k$=0 Oe). On the contrary, FIGS. 7 to 11 illustrate the phase diagrams in which the horizontal axis represents the external magnetic field $H_k$ (the pulse peak value of the bias current magnetic field 72).

The external magnetic field $H_x$ is one disturbance factor applied to the memory cells. When the external magnetic field $H_x$ is large to some extent, the current value $I_z$ of the write pulse is applied, thus increasing the possibility of occurrence of the white areas where the magnetization state of a memory cell is unable to be reversed.

Therefore, the smaller the total area of the white areas, the more the memory layer magnetization 53 becomes difficult to be oriented in the direction of the quasi-stable state, and the stronger the memory cells against external disturbance.

Figure 7:
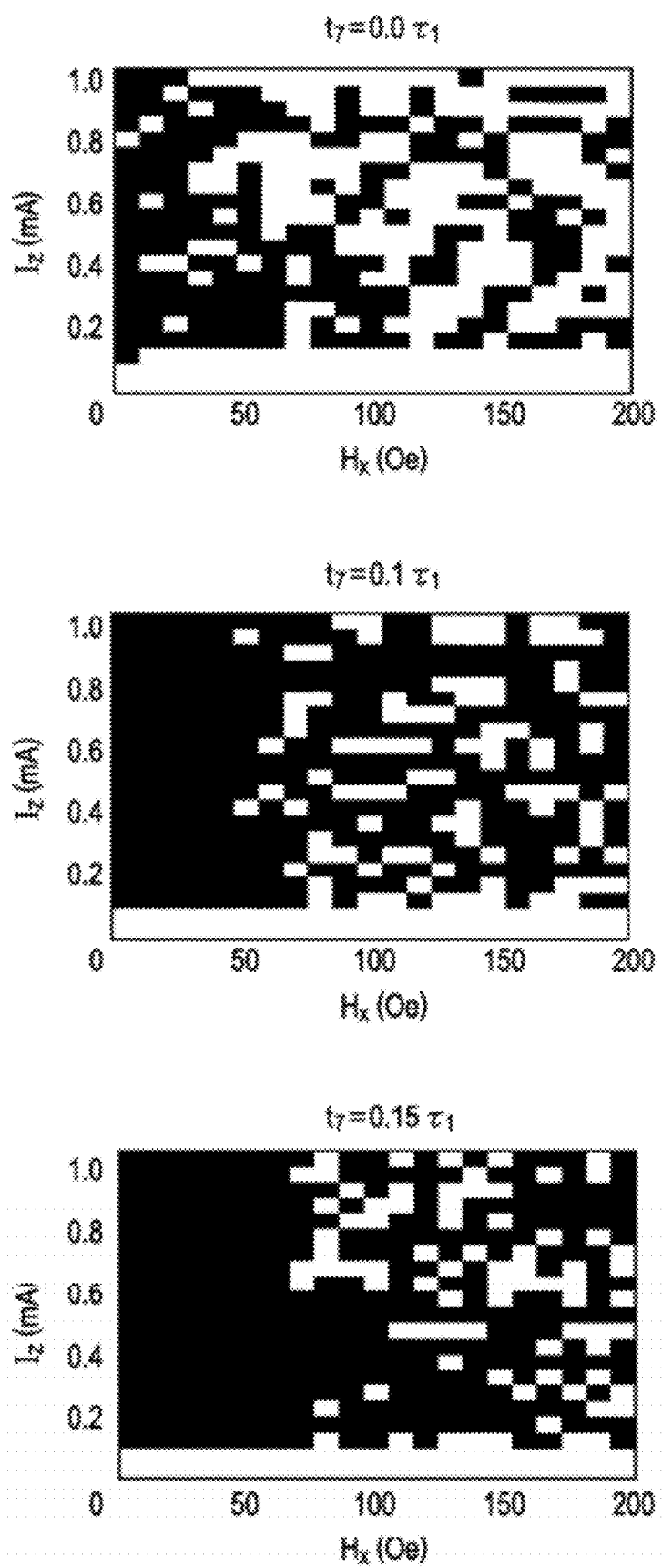
FIG. 7 is a state diagram of the memory cells according to the first embodiment when the hold time is increased from zero.
Figure 8:
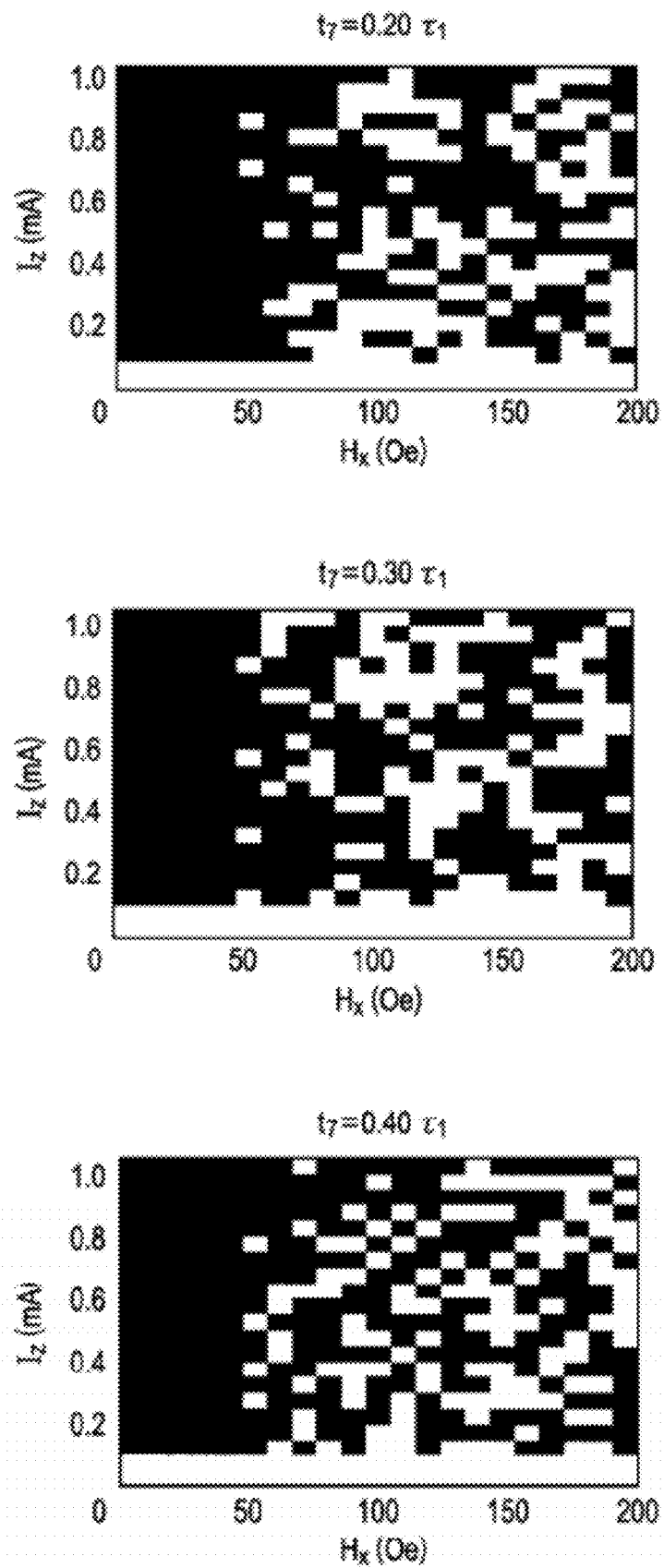
FIG. 8 is a state diagram of the memory cells when the hold time is changed greater than the case of FIG. 7.
Figure 9:
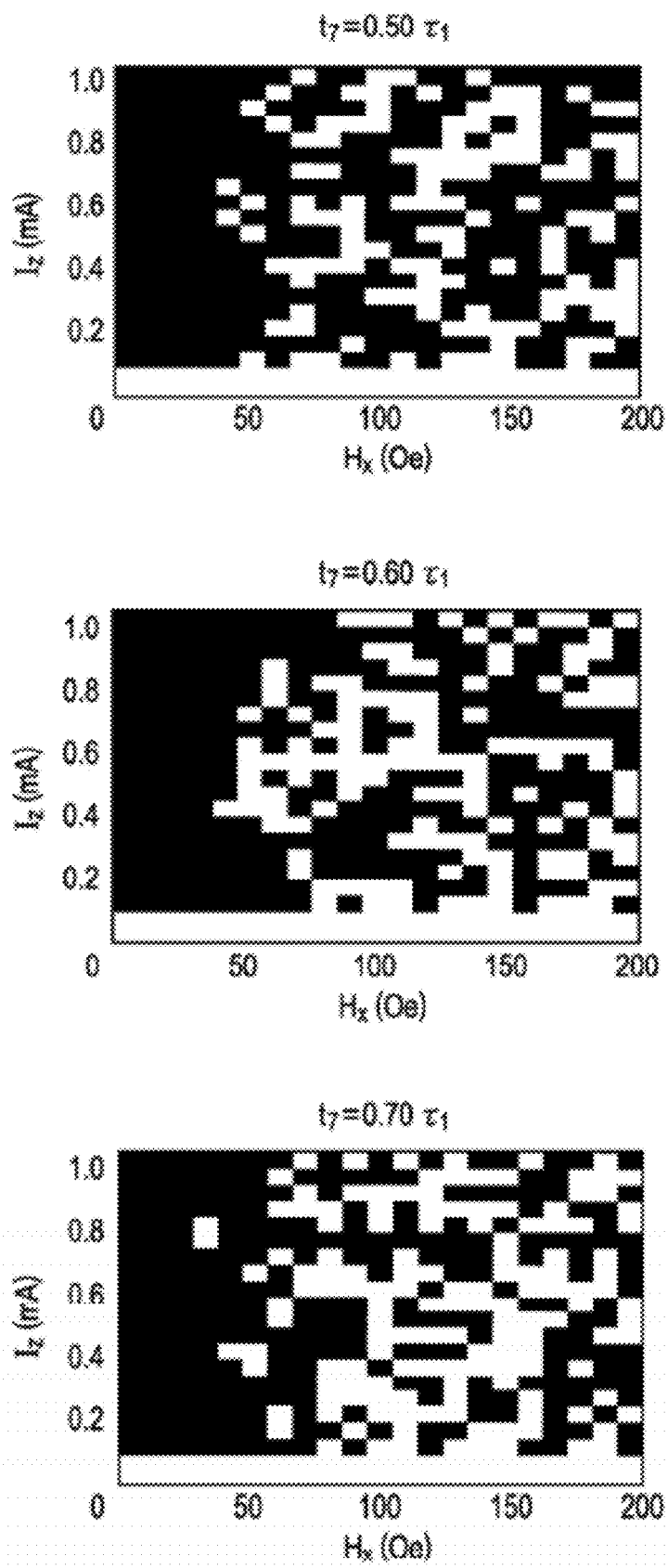
FIG. 9 is a state diagram of the memory cells when the hold time is changed greater than the case of FIG. 8.
Figure 10:
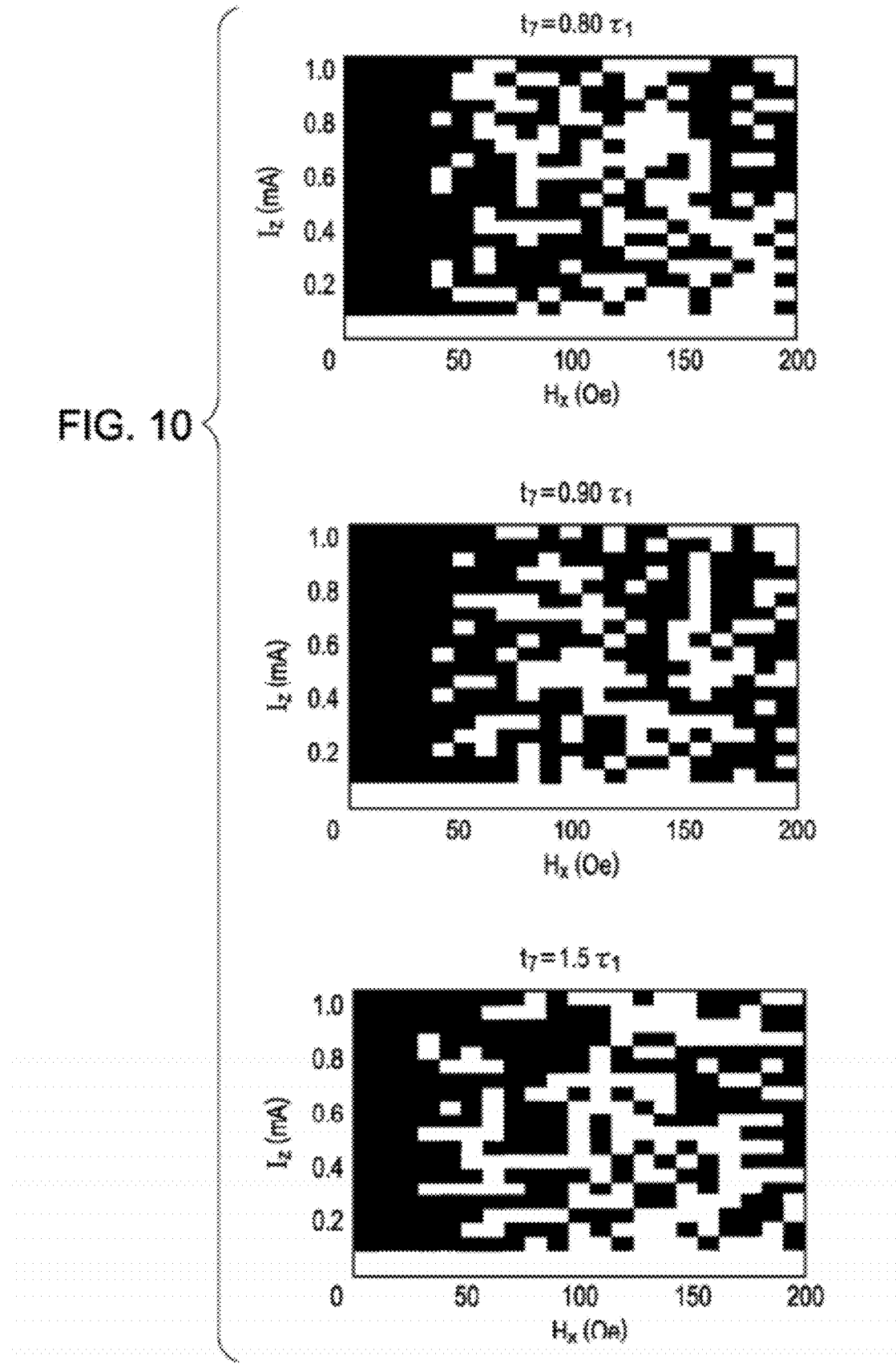
FIG. 10 is a state diagram of the memory cells when the hold time is changed greater than the case of FIG. 9.
Figure 11:
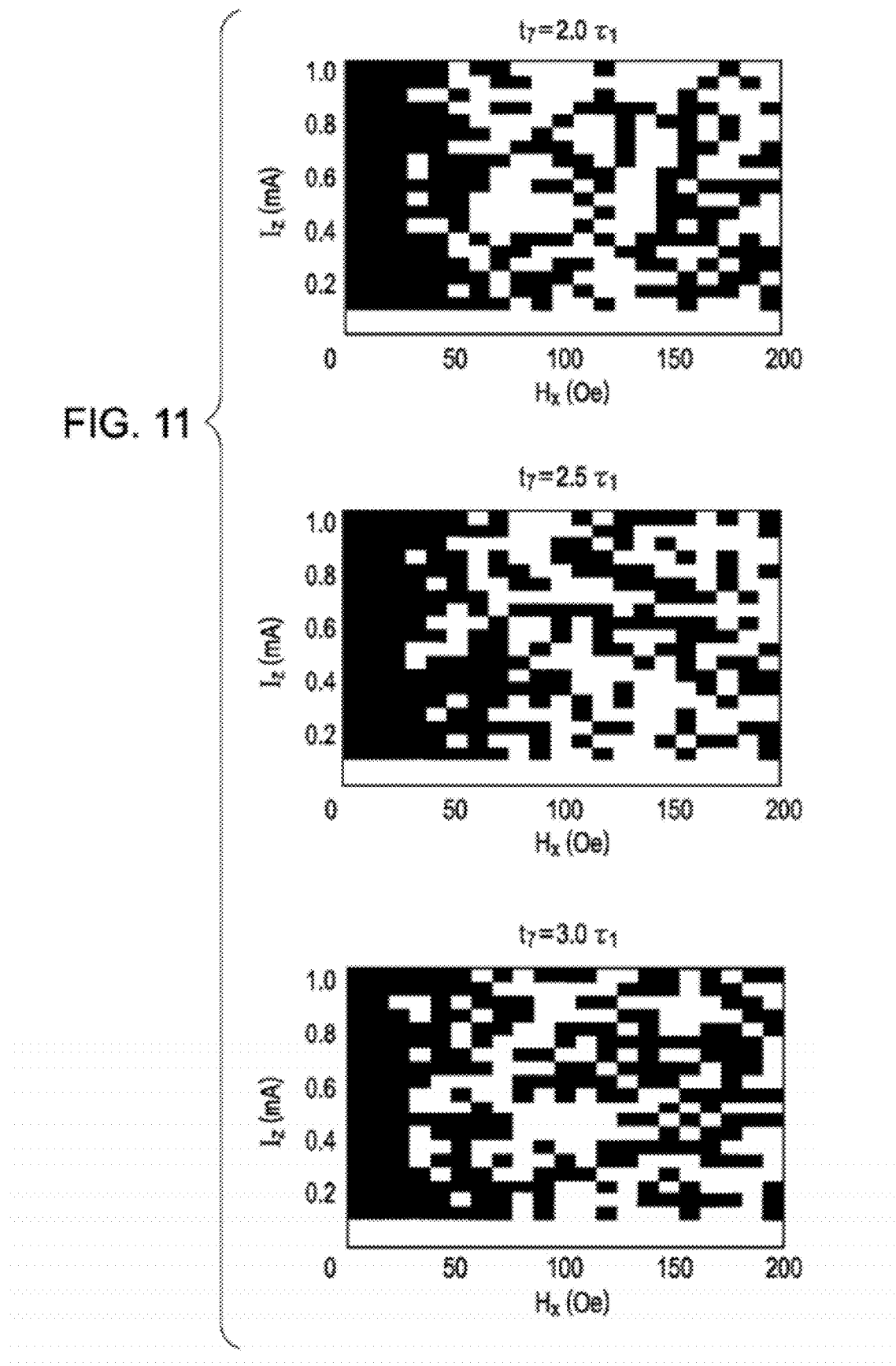
FIG. 11 is a state diagram of the memory cells when the hold time is changed greater than the case of FIG. 10.

It was found from FIG. 7 that if there is the hold time $t_7$, namely if the hold time is equal to or greater than $0.1\tau_1$, the memory layer magnetization 53 becomes difficult to be oriented in the direction of the quasi-stable state.

Moreover, it was found that although the total area of the white areas did not show a great increase when the hold time $t_7$ was maintained in the range of $0.2\tau_1$ to $1.5\tau_1$, the total area of the white areas showed a great increase when the hold time $t_7$ became $2.0\tau_1$.

From the above findings, it can be concluded that the hold time $t_7$ given by Equation 6 has an appropriate range.

On the other hand, the offset pulse is applied during the hold state in order for the memory layer magnetization 53 to continue the precessional movement corresponding to a weak spin-transfer torque.

By making sure that the memory layer magnetization 53 experiences the spin-transfer torque, it is possible to maintain high temporal coherence and achieve smooth magnetization rotation.

The current value $I_{z0}$ generated by the offset pulse has to be smaller than the peak value of the current pulse train and be in a range of values where the torque from the effective magnetic field is not negligible compared to the spin-transfer torque. With respect to the threshold current expressed by Equation 4, the current value $I_{z0}$ preferably satisfies the relation given by Equation 7.

$$I_{z0}<10I_{th0} \quad \text{Equation 7}$$

For example, it will be assumed that the anisotropic magnetic field $H_k$ of the memory layer 16 is set to 25 Oe, the saturated magnetization $M_s$ is set to 400 emu/cc, the film thickness $t_F$ is set to 2 nm, the bias current magnetic field $H_x$ is set to 0 Oe, the injection efficiency g is set to 0.68, the cross-sectional area $S_A$ of the magneto-resistance effect element 1 is set to $1.2\times10^{-10}$ cm$^2$, and the damping constant $\alpha$ is set to 0.007. In that case, since the threshold current $I_{th0}$ will be about 0.074 mA, a relation of $I_{z0}<I_z$ and $I_{z0}<0.74$ mA should be met in order to satisfy the relation of Equation 7.

The threshold current expressed by Equation 4 has a property that it is proportional to the square of the saturated magnetization of the memory layer 16. Therefore, when a change in the saturated magnetization due to self-heating or ambient temperature is not negligible, it is preferable to control the current value $I_{z0}$ of the offset pulse in consideration of the influence of temperature.

Since the Equations 5, 6, and 7 are indirectly sensitive to the magnitude of the saturated magnetization of the memory layer 16, it is desirable for a memory circuit using the SpRAM to incorporate therein a reference circuit for detecting the magnitude of the saturated magnetization.

Figure 12:
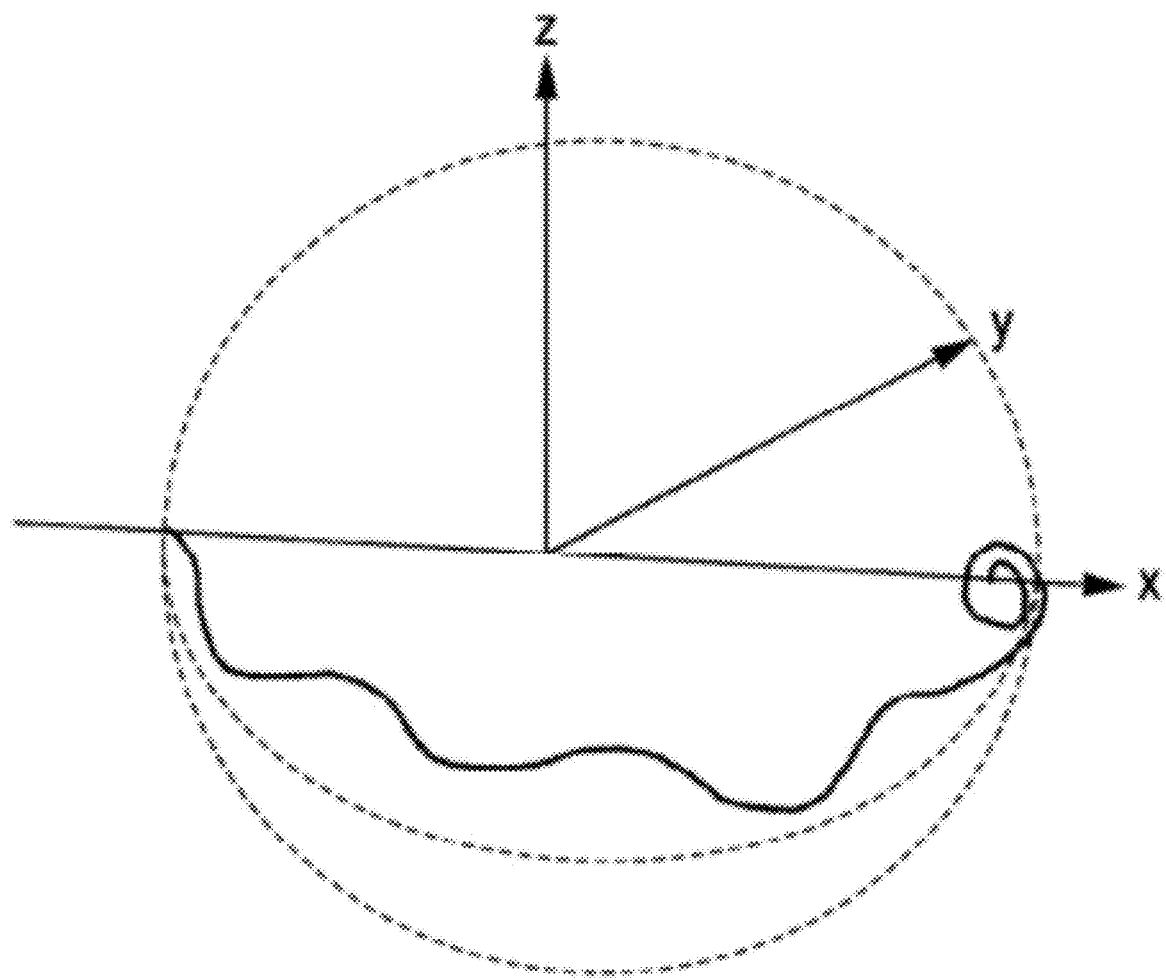
FIG. 12 is a schematic diagram showing the transition process of magnetization according to the first embodiment when the magnetization reversal is realized normally.

FIG. 12 is a schematic diagram showing the transition process of magnetization when the magnetization reversal according to the first embodiment when the magnetization reversal is realized normally.

It will be assumed that in the initial state, the memory layer magnetization 53 is oriented in the positive x-axis direction, and the reference layer magnetization 52 is oriented in the negative x-axis direction. By applying the current pulse train at appropriate intervals of the hold time, the memory layer magnetization 53 can finish its transition without being oriented in the direction of the quasi-stable state.

Figure 13:
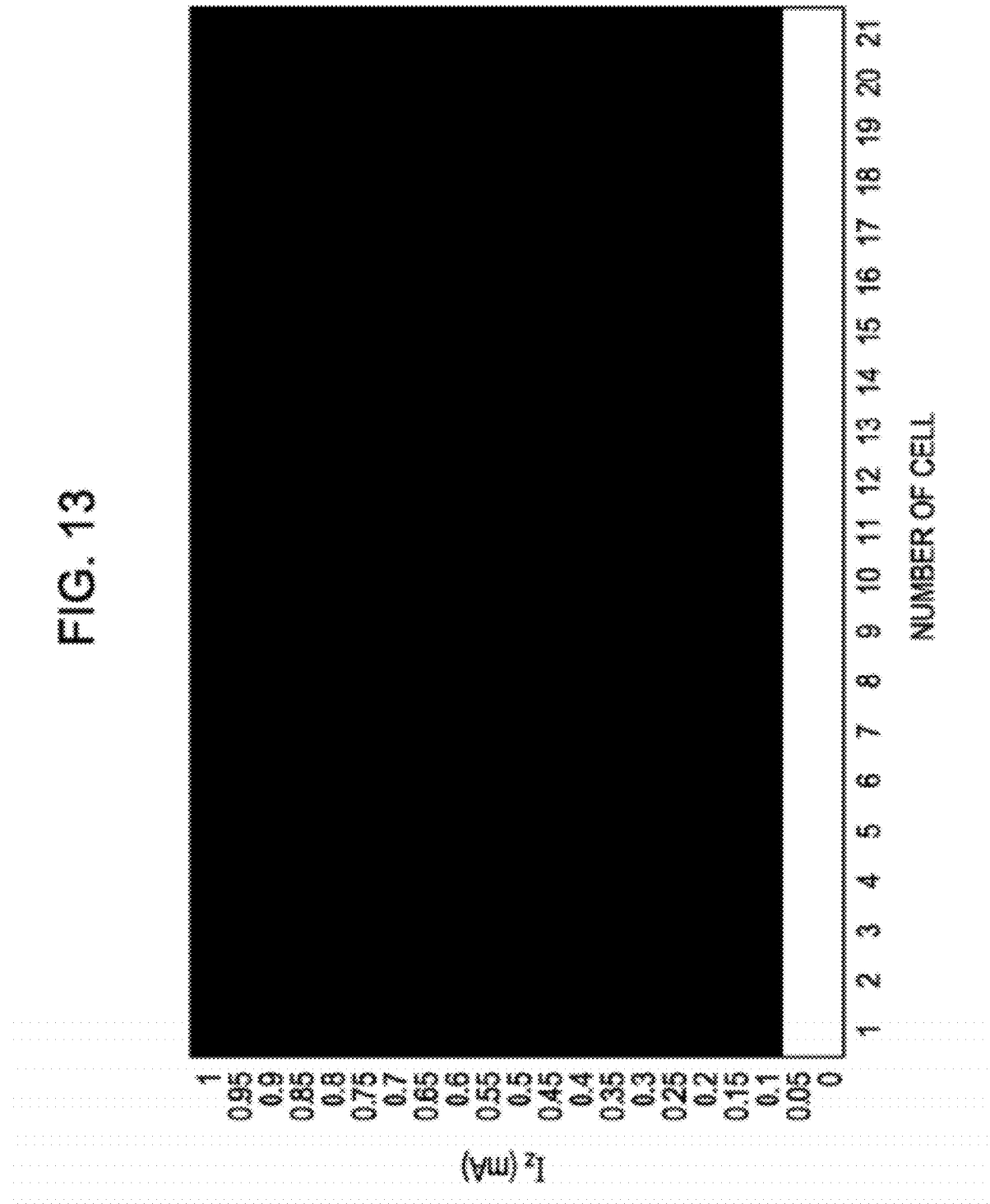
FIG. 13 is a state diagram of the memory cells according to the first embodiment when the sum of the duration and the hold time of a current pulse train was set to 10 [ns]

FIG. 13 is a memory cell state diagram according to the first embodiment when the sum of the duration and the hold time of the current pulse train was set to 10 [ns].

In the memory cell state diagram, the vertical axis represents the peak value of the current pulse train, and the horizontal axis represents the address of the memory cells. The duration of the current pulse is modulated in accordance with the Equations 3 and 5.

In FIG. 13, when the current peak value was 1 [mA], the pulse duration was set to 100 [ps] or smaller, the pulse hold time was set to 1.5 [ns], and the peak value of the offset pulse was set to 0.05 [mA].

By performing the switching using the combined waveform of the plurality of current pulse trains and offset pulses of the same polarity, it was possible to completely eliminate the occurrence of such a state where the reversal results become indefinite, which was observed in FIG. 4.

Second Embodiment

According to the first embodiment, it is possible to prevent the switching finished state of the SpRAM from transitioning to a different state from the intended state.

Basically, this method aims to repeats a small amount of magnetization rotation corresponding to the current density. However, when the current density is high, it is necessary to decrease the pulse width to be very short. Since the designing or manufacturing burden on the peripheral circuit of the SpRAM increases when the pulse width is too short, the restriction on the pulse width is preferably as loose as possible.

In order to achieve this object, a method was devised in which the polarity of the offset pulse is reversed to be opposite to the polarity of the current pulse train.

Figure 14:
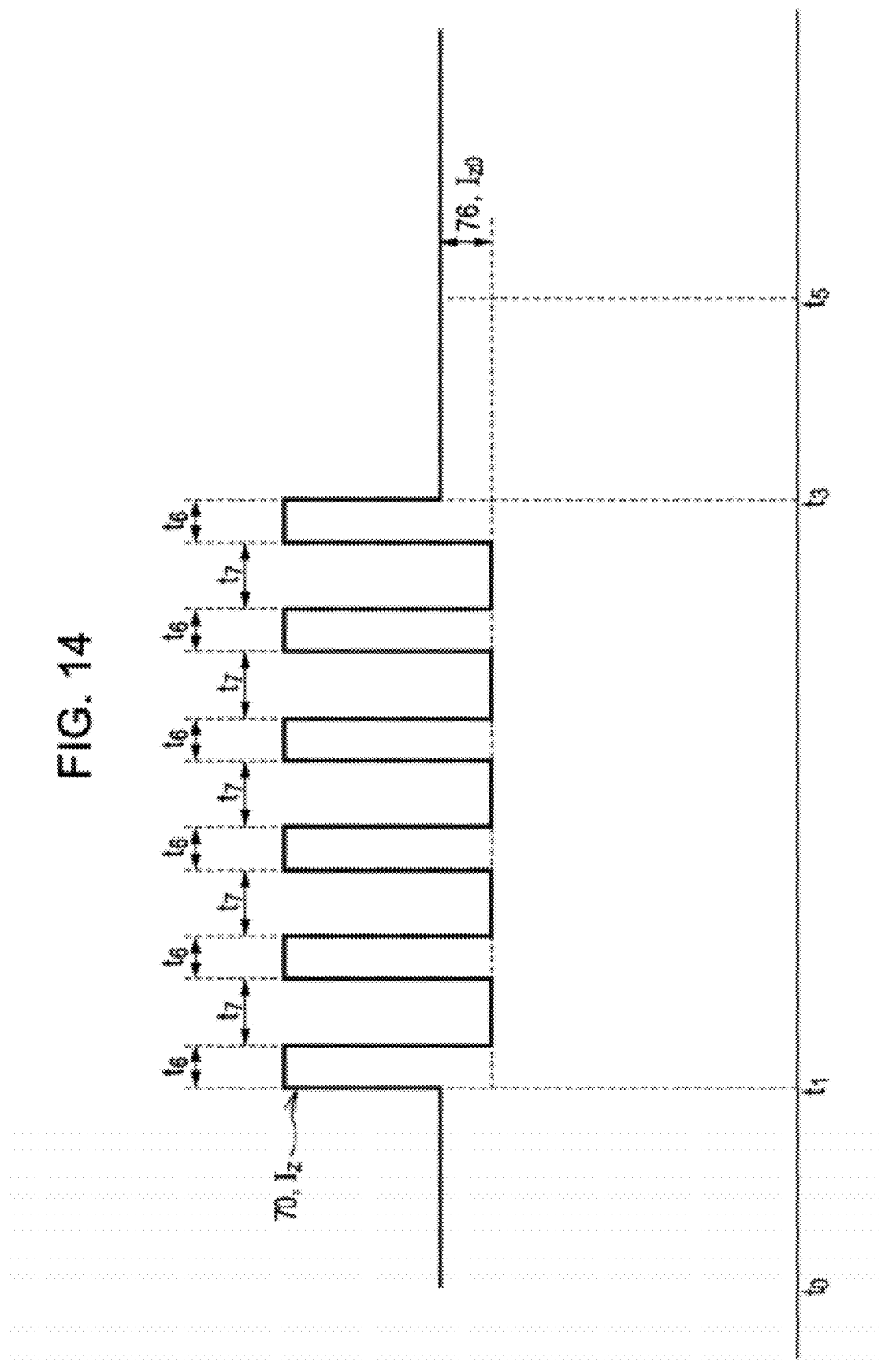
FIG. 14 is a timing diagram showing the application time of an injection current to a SpRAM according to a second embodiment.

FIG. 14 is a timing diagram showing the application time of the injection current 70 in a SpRAM according to the second embodiment.

The waveform shown in FIG. 14 is designed to perform switching using a combined waveform of a plurality of current pulse trains and offset pulses of the opposite polarity.

During the duration $t_6$ of the current pulse train, since the spin-transfer torque is greater than the torque from the effective magnetic field, the rotation angle per unit time of the memory layer magnetization 53 can be generally expressed by Equation 3.

The duration $t_6$ of the current pulse train is determined so as to satisfy Equation 8 below.

That is to say, the condition that the magnetization rotation angle does not exceed a critical angle is given by the following equation.

$$\omega_{spin} t_6 < \theta_{critical} \qquad \text{Equation 8}$$

Equation 8 means that the rotation angle per one pulse is restricted to be equal to or smaller than the critical angle $\theta_{critical}$.

As a result of thorough investigation on the magnetization characteristics, it was found that in the second embodiment, the critical angle $\theta_{critical}$ is identical to 90 degrees. The magnetization state can be switched to any of the stable states by repeating a small amount of magnetization rotation corresponding to a current density so that the memory layer magnetization 53 is not oriented in the direction of the quasi-stable state.

The repeated small magnetization rotation can be realized by only using the combined waveform with the offset pulses. However, in order to realize the magnetization rotation corresponding to the current density, the duration $t_6$ of the pulse train desirably satisfy the relation of Equation 8. However, it is permitted that the rotation angle per one pulse is identical to the critical angle.

For example, it will be assumed that the saturated magnetization $M_s$ of the memory layer 16 is set to 400 emu/cc, the film thickness $t_F$ is set to 2 nm, the injection efficiency g is set to 0.68, and the current density $J_Z$ is set to 10 MA/cm$^2$. In that case, since the angular rotation frequency $\omega_{spin}/2\pi$ will be about 1.6 GHz, a relation of $t_6 < 320$ ps should be met in order to satisfy the relation of Equation 8.

According to this embodiment, it is possible to ease the restriction on the current pulse width compared to the first embodiment.

Since the magnetization rotation frequency decreases as the current density decreases, the duration $t_6$ of the current pulse train may be increased further.

For example, if the current density $J_Z$ is set to 1 MA/cm$^2$, the duration of the pulse train satisfying the relation of $t_6 < 3.20$ ns can be achieved. By doing so, it is possible to reduce the circuit burden imposed on a pulse generation circuit (a driving circuit; refer to a later-described PWM circuit).

The duration $t_6$ of the current pulse train can be controlled by performing pulse width modulation in accordance with the current density. Therefore, a pulse width modulation circuit that detects a voltage proportional to the current density to control the modulation degree can be used.

The rotational angular velocity of the magnetization expressed by Equation 3 has a property that it is inverse proportional to the saturated magnetization of the memory layer 16. Therefore, when a change in the saturated magnetization due to self-heating or ambient temperature is not negligible, it is preferable to control the pulse width modulation circuit in consideration of the influence of temperature.

The hold time $t_7$ between one current pulse and a next current pulse is the time necessary for the memory layer magnetization 53 to return to the vicinity of a plane where the stable state exists. By appropriately maintaining the hold time, the memory layer magnetization 53 can be prevented from being oriented in the direction of the quasi-stable state.

During the hold time $t_7$, since the torque from the effective magnetic field is not negligible compared to the spin-transfer torque, the relaxation time of the memory layer magnetization 53 is given by Equation 2.

As a result of thorough investigation on the magnetization characteristics, the hold time $t_7$ between one current pulse and a next current pulse desirably satisfy the relation of Equation 9.

$$0.05\tau_1 < t_7 < 0.75\tau_1 \qquad \text{Equation 9}$$

For example, it will be assumed that the anisotropic magnetic field $H_k$ of the memory layer 16 is set to 25 Oe, the saturated magnetization $M_s$ is set to 400 emu/cc, and the damping constant $\alpha$ is set to 0.007. In that case, since the relaxation time $\tau_1$ will be about 3.2 ns, a relation of 0.16 ns $< t_7 <$ 2.4 ns should be met in order to satisfy the relation of Equation 9. When it is inappropriate to treat the hold time $t_7$ as a fixed value, it is preferable to use a pulse width modulation circuit.

The relaxation time expressed by Equation 2 has a property that it is inverse proportional to the saturated magnetization of the memory layer 16. Therefore, when a change in the saturated magnetization due to self-heating or ambient temperature is not negligible, it is preferable to control the pulse width modulation circuit in consideration of the influence of temperature.

The offset pulse is applied during the hold state in order for the memory layer magnetization 53 to continue the precessional movement corresponding to a weak spin-transfer torque.

By making sure that the memory layer magnetization 53 experiences the spin-transfer torque, it is possible to maintain high temporal coherence and achieve smooth magnetization rotation.

The current value $I_{z0}$ generated by the offset pulse has to be smaller than the peak value of the current pulse train and be in a range of values where the torque from the effective magnetic field is not negligible compared to the spin-transfer torque. With respect to the threshold current expressed by Equation 4, the current value $I_{z0}$ preferably satisfies the relation given by Equation 10.

$$-10 I_{th0} < I_{z0} \qquad \text{Equation 10}$$

For example, it will be assumed that the anisotropic magnetic field $H_k$ of the memory layer 16 is set to 25 Oe, the saturated magnetization $M_s$ is set to 400 emu/cc, the film thickness $t_F$ is set to 2 nm, the bias current magnetic field $H_x$ is set to 0 Oe, the injection efficiency g is set to 0.68, the cross-sectional area $S_A$ of the magneto-resistance effect element 1 is set to $1.2 \times 10^{-10}$ cm$^2$, and the damping constant $\alpha$ is set to 0.007. In that case, since the threshold current $I_{th0}$ will be about 0.074 mA, a relation of $I_{z0} < I_z$ and $-0.74$ mA$<I_{z0}$ should be met in order to satisfy the relation of Equation 10.

The threshold current expressed by Equation 4 has a property that it is proportional to the square of the saturated magnetization of the memory layer 16. Therefore, when a change in the saturated magnetization due to self-heating or ambient temperature is not negligible, it is preferable to control the current value $I_{z0}$ of the offset pulse in consideration of the influence of temperature.

Since the Equations 8, 9, and 10 are indirectly sensitive to the magnitude of the saturated magnetization of the memory layer 16, it is desirable for a memory circuit using the SpRAM to incorporate therein a reference circuit for detecting the magnitude of the saturated magnetization.

Figure 15:
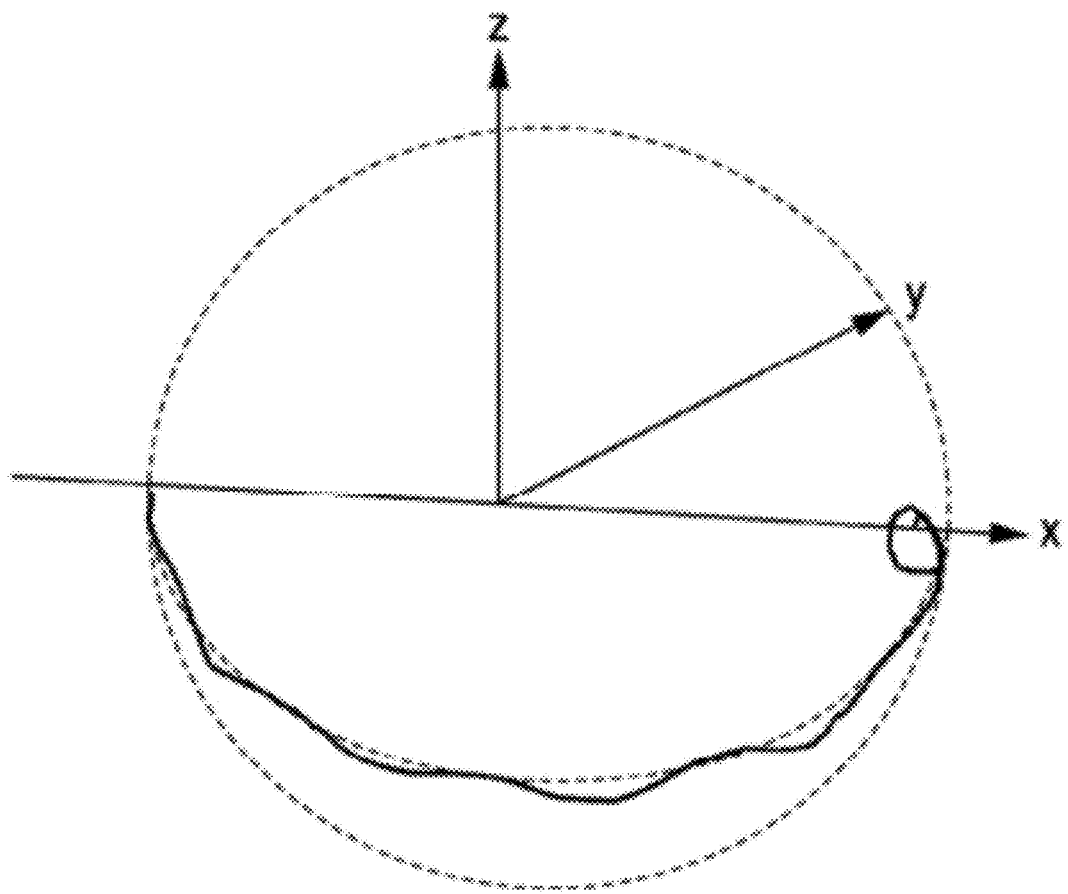
FIG. 15 is a schematic diagram showing the transition process of magnetization according to the second embodiment when the magnetization reversal is realized normally.

FIG. 15 is a schematic diagram showing the transition process of magnetization when the magnetization reversal according to the second embodiment when the magnetization reversal is realized normally.

It will be assumed that in the initial state, the memory layer magnetization 53 is oriented in the positive x-axis direction, and the reference layer magnetization 52 is oriented in the negative x-axis direction. By applying the current pulse train at appropriate intervals of the hold time, the memory layer magnetization 53 can finish its transition without being oriented in the direction of the quasi-stable state.

Since the offset pulse has the opposite polarity, the magnetization in its transition passes a trajectory distant from the quasi-stable state in the positive z-axis direction.

Figure 16:
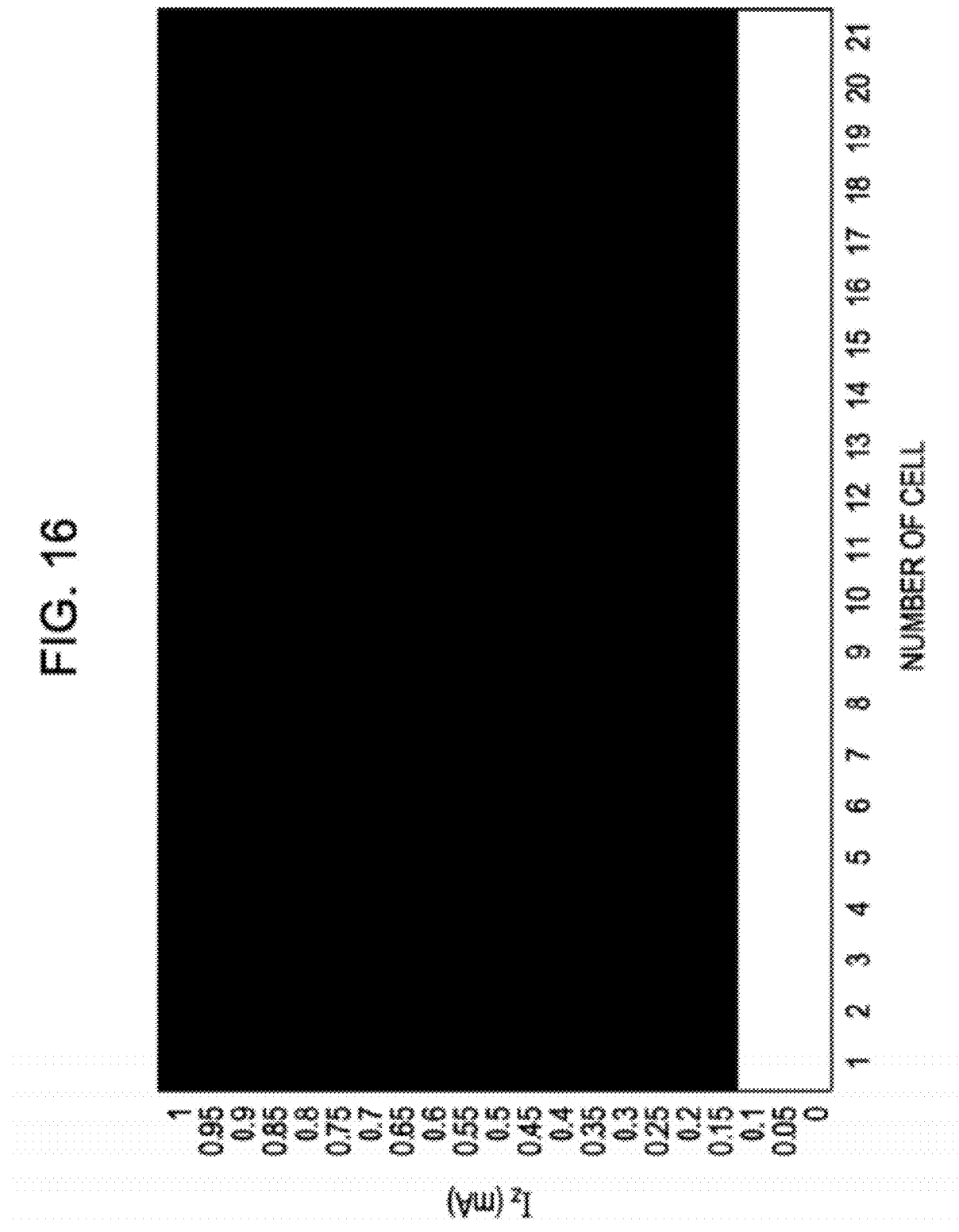
FIG. 16 is a state diagram of the memory cells according to the second embodiment when the sum of the duration and the hold time of a current pulse train was set to 10 [ns]

FIG. 16 is a memory cell state diagram according to the second embodiment when the sum of the duration and the hold time of the current pulse train was set to 10 [ns].

In the memory cell state diagram, the vertical axis represents the peak value of the current pulse train, and the horizontal axis represents the address of the memory cells. The duration of the current pulse is modulated in accordance with the Equations 3 and 5.

In FIG. 16, when the current peak value was 1 [mA], the pulse duration was set to 200 [ps] or smaller, the pulse hold time was set to 0.8 [ns], and the peak value of the offset pulse was set to −0.05 [mA].

By performing the switching using the combined waveform of the plurality of current pulse trains and offset pulses of the opposite polarity, it was possible to completely eliminate the occurrence of such a state where the reversal results become indefinite, which was observed in FIG. 4.

Since the offset pulse has the opposite polarity, it is not possible to obviate an overall increase in the threshold current.

In the first and second embodiments, as expressed by the Equations 7 and 10, the peak value of the offset pulse has to satisfy the relation that "the absolute value of the current component based on the offset pulse is greater than zero and smaller than 10 times the minimum threshold current capable of reversing the magnetization of the memory cell".

Figure 17:
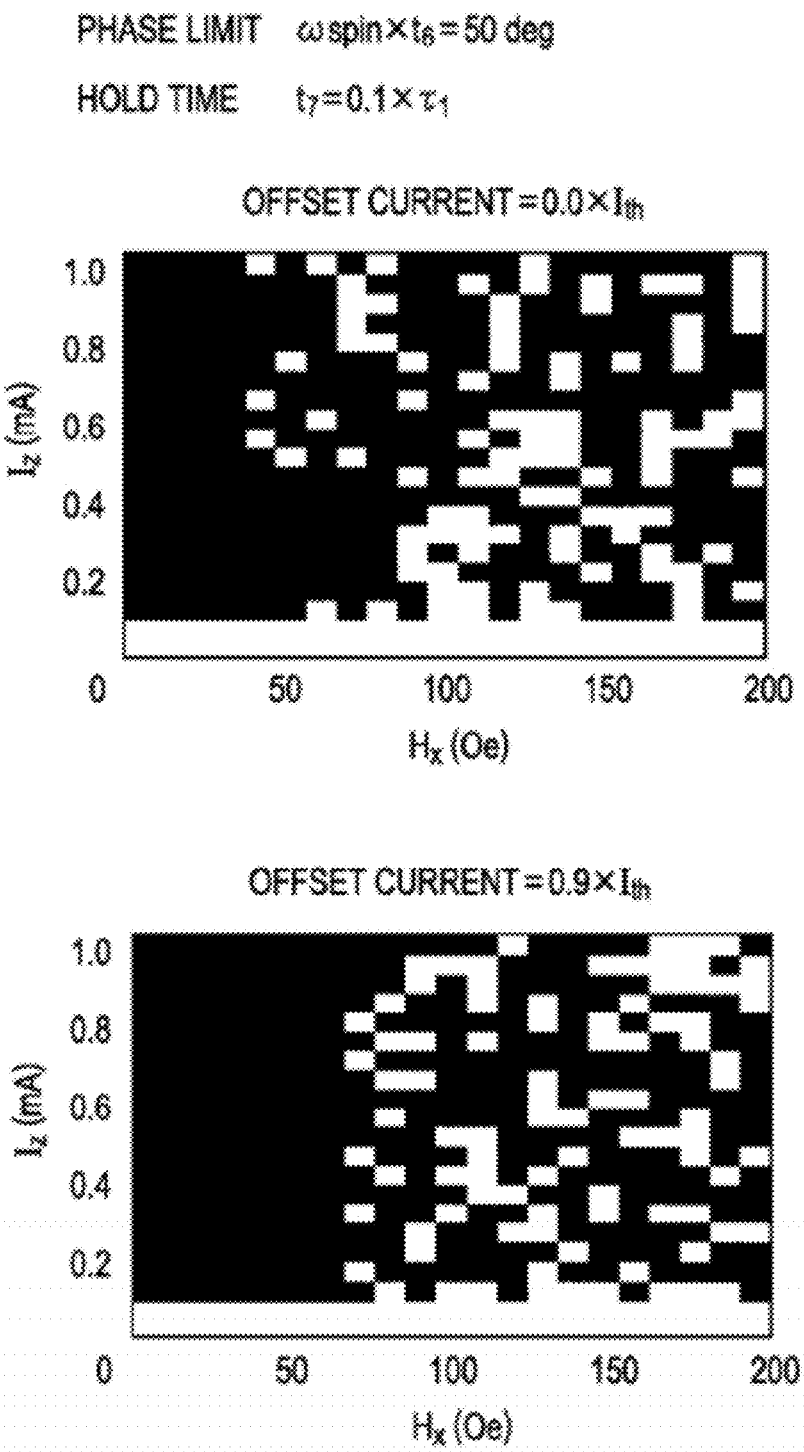
FIG. 17 is a state diagram of the memory cells showing the difference between existence and non-existence of an offset current.

In FIG. 17, the phase diagrams when there is no offset current ($0.0 \times I_{th}$) and when there is a small offset current ($0.9 \times I_{th}$) are illustrated for comparison. Here, $0.9 \times I_{th}$ is only an example of the case where there is a small offset current.

It can be found from FIG. 17 that when the offset current is greater than zero, the total area of the white areas decreases, and thus, the memory layer magnetization 53 can be effectively prevented from being oriented in the direction of the quasi-stable state.

FIG. 18 shows an example of a driving circuit which can be used with the first and second embodiments.

The resistance variable memory device shown in FIG. 18 includes a memory cell array 2 and a peripheral circuit thereof The memory cell array 2 includes the memory cells shown in FIG. 1 which are arranged in matrix. In FIG. 18, the source line SL is not shown for the simplicity's sake. The number of cells included in the row and column directions of the memory cell array 2 is arbitrary. The rows of the memory cell array 2 are selected via the word line WL, and the columns are selected when an output permission signal is supplied to a driving circuit 5 of each column or by a switch that selectively connects the driving circuit of each column to the bit line BL.

The peripheral circuit includes a row decoder (R.DEC) 3 for row selection and a DC controller (C.DEC) 4 for column selection.

An address signal ADR is input to the row decoder 3 and the column decoder 4, whereby a selected column of the memory cell array 2 is designated by a number bit thereof, and a selected row of the memory cell array 2 is designated by the remaining number bit.

The row decoder 3 sets the word line WL of the row designated by the address signal ADR to an active ("H" in this example) level.

The column decoder 4 connects the driving circuit 5 to a power supply based on the decoding results. Alternatively, the column decoder 4 may switch on a non-illustrated switch so as to connect a predetermined bit line BL to a corresponding driving circuit 5.

The driving circuit 5 is configured to generate the pulses shown in FIG. 6 or 14 and control the supply thereof and includes a PWM circuit 5A as a constituent element or a function.

As described above, according to the first and second embodiments, it is possible to eliminate the instability of the spin-transfer magnetization reversal without greatly changing the structure of the SpRAM and reverse the data "0" and "1" of the memory cells with high reliability. Therefore, it is possible to facilitate the miniaturization of the SpRAM and achieve high reliability, large storage capacity, and low power consumption.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A resistance variable memory device comprising:
    a resistance variable memory cell that writes data by utilizing a spin transfer effect based on an injection current; and
    a driving circuit that generates a combined pulse of a plurality of write pulses and an offset pulse defining the level between the write pulses and supplies the combined pulse to the memory cell at the time of the writing.

2. The resistance variable memory device according to claim 1, wherein an absolute value of a current component based on the offset pulse is greater than zero and smaller than 10 times a minimum threshold current capable of reversing the magnetization of the memory cell by the injection current.

3. The resistance variable memory device according to claim 1, wherein:
    a duration of each of the pulse has a time length where the product of the duration and the frequency of a magnetization rotation angle is equal to or smaller than 90 degrees; and,
    a hold time between the pulses is in a range of 0.1 to 2 times a relaxation time of a memory layer magnetization.

4. The resistance variable memory device according to claim 1, wherein:
    the offset pulse has a polarity opposite to the plurality of pulses;
    a duration of each of the pulse has a time length where the product of the duration and a frequency of a magnetization rotation angle is equal to or smaller than 180 degrees; and,
    a hold time between the pulses is in a range of 0.05 to 1 times the relaxation time of a memory layer magnetization.

5. The resistance variable memory device according to claim 3, wherein an absolute value of a current component based on the offset pulse is greater than zero and smaller than 10 times a minimum threshold current capable of reversing the magnetization of the memory cell by the injection current.

6. The resistance variable memory device according to claim 4, wherein an absolute value of a current component based on the offset pulse is greater than zero and smaller than 10 times a minimum threshold current capable of reversing the magnetization of the memory cell by the injection current.

7. The resistance variable memory device according to claim 1, wherein the driving circuit includes a pulse width modulation circuit that detects a voltage proportional to a density of the injection current to control a modulation degree, thereby determining a duration of each of the pulses.

8. The resistance variable memory device according to claim 1, wherein the driving circuit includes a pulse width modulation circuit that determines a duration and a hold time of each of the pulses by performing pulse width modulation in consideration of a change in the saturated magnetization due to self-heating or ambient temperature.

9. A resistance variable memory device comprising:
    a resistance variable memory cell that writes data by utilizing a spin transfer effect based on an injection current; and
    a driving circuit that generates a combined pulse of a plurality of write pulses and an offset pulse having a polarity opposite to the write pulse and defining a level between the write pulses and supplies the combined pulse to the memory cell at the time of the writing.

* * * * *